(12) United States Patent
Kato et al.

(10) Patent No.: US 9,312,269 B2
(45) Date of Patent: Apr. 12, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Kiyoshi Kato, Kanagawa (JP); Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/272,853

(22) Filed: May 8, 2014

(65) Prior Publication Data

US 2014/0339541 A1    Nov. 20, 2014

(30) Foreign Application Priority Data

May 16, 2013 (JP) .................................. 2013-104320
Oct. 31, 2013 (JP) .................................. 2013-227346
Feb. 13, 2014 (JP) .................................. 2014-025003

(51) Int. Cl.
*H01L 29/10* (2006.01)
*H01L 29/12* (2006.01)
*H01L 27/115* (2006.01)
(Continued)

(52) U.S. Cl.
CPC ........ *H01L 27/11563* (2013.01); *G11C 11/005* (2013.01); *G11C 14/0054* (2013.01); *H01L 27/105* (2013.01); *H01L 27/10805* (2013.01); *H01L 27/10894* (2013.01); *H01L 27/1108* (2013.01); *H01L 27/1156* (2013.01)

(58) Field of Classification Search
CPC ............ H01L 27/11563; H01L 27/105; H01L 27/10805; H01L 27/10894; H01L 27/1156; H01L 27/1108; G11C 11/005
See application file for complete search history.

(56) References Cited

U.S. PATENT DOCUMENTS 5,534,884 A    7/1996    Mase et al.
5,731,856 A    3/1998    Kim et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Victor A Mandala
(74) *Attorney, Agent, or Firm* — Fish & Richardson P.C.

(57) ABSTRACT

A semiconductor device with a novel structure in which storage capacity needed for holding data can be secured even with miniaturized elements is provided. In the semiconductor device, electrodes of a capacitor are an electrode provided in the same layer as a gate of a transistor and an electrode provided in the same layer as a source and a drain of the transistor. Further, a layer in which the gate of the transistor is provided and a wiring layer connecting the gates of the transistors in a plurality of memories are provided in different layers. With this structure, parasitic capacitance formed around the gate of the transistor can be reduced, and the capacitor can be formed in a larger area.

14 Claims, 30 Drawing Sheets

(51) Int. Cl.
*H01L 27/108* (2006.01)
*G11C 11/00* (2006.01)
*H01L 27/105* (2006.01)
*G11C 14/00* (2006.01)
*H01L 27/11* (2006.01)

(56) References Cited

U.S. PATENT DOCUMENTS

| | | |
|---|---|---|
| 5,744,864 A | 4/1998 | Cillessen et al. |
| 5,982,471 A | 11/1999 | Hirakata et al. |
| 6,169,532 B1 | 1/2001 | Sumi et al. |
| 6,266,038 B1 | 7/2001 | Yoshida et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,961,042 B2 | 11/2005 | Murai |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,098,880 B2 | 8/2006 | Inoue et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,517 B2 | 6/2010 | Kawamura et al. |
| 8,067,775 B2 | 11/2011 | Miyairi et al. |
| 8,378,403 B2 | 2/2013 | Kato |
| 8,809,853 B2 | 8/2014 | Saito et al. |
| 8,854,865 B2 | 10/2014 | Saito |
| 2001/0020928 A1 | 9/2001 | Yanagisawa et al. |
| 2001/0046027 A1 | 11/2001 | Tai et al. |
| 2002/0003271 A1 | 1/2002 | Ikeda et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0219188 A1 | 10/2005 | Kawabe et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0205976 A1 | 9/2007 | Takatori et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042968 A1 | 2/2008 | Oh |
| 2008/0050595 A1 | 2/2008 | Nakagawara et al. |
| 2008/0055218 A1 | 3/2008 | Tsuda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284970 A1 | 11/2008 | Ishitani |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0079684 A1 | 3/2009 | Watanabe |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0244020 A1 | 9/2010 | Sakata et al. |
| 2011/0122670 A1* | 5/2011 | Yamazaki et al. ............. 365/72 |
| 2011/0134683 A1* | 6/2011 | Yamazaki et al. ............ 365/149 |
| 2011/0227074 A1* | 9/2011 | Kato et al. ..................... 257/57 |
| 2012/0001243 A1* | 1/2012 | Kato ............................. 257/296 |
| 2012/0032164 A1* | 2/2012 | Ohnuki ........................... 257/43 |
| 2012/0061668 A1 | 3/2012 | Miyairi et al. |
| 2012/0075917 A1 | 3/2012 | Takemura |
| 2012/0161220 A1 | 6/2012 | Yamazaki |
| 2012/0262982 A1 | 10/2012 | Takemura |
| 2012/0292613 A1* | 11/2012 | Shionoiri et al. ............... 257/43 |
| 2012/0294068 A1 | 11/2012 | Ishizu |
| 2012/0294102 A1 | 11/2012 | Ishizu |
| 2013/0069132 A1 | 3/2013 | Atsumi et al. |
| 2013/0140569 A1 | 6/2013 | Yoneda et al. |
| 2013/0221356 A1 | 8/2013 | Yamazaki et al. |
| 2013/0258746 A1 | 10/2013 | Kurokawa |
| 2013/0326309 A1 | 12/2013 | Yoneda |
| 2014/0325249 A1 | 10/2014 | Toyotaka |
| 2014/0374747 A1 | 12/2014 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| JP | 08-264794 A | 10/1996 |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-113359 A | 6/2011 |
| JP | 2011-113362 A | 6/2011 |
| JP | 2013-008436 A | 1/2013 |
| JP | 2013-008437 A | 1/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM '05 : Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 ; SID International Symposium Digest of Technical Papers, May 31, 2009, pp. 1110-1112.

Godo.H et al., "Temperature Dependence of Characteristics and Electronic Structure of Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Paper, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystaline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122101-122101-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layes", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application"SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-366.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350°C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)m$ (m<4): a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zing Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display" SID Digest '08 : SID International Symposium Digest of Technical Papers, May 20, 2008, Vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-2652.

Sakata.J et al., "Development of 4.0-In. AMOLED Display With Driver Circuit Using Amorphus In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 ; SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a memory device, a driving method thereof, or a manufacturing method thereof. In particular, the present invention relates to a semiconductor device.

2. Description of the Related Art

A semiconductor device capable of holding data that includes a transistor whose semiconductor layer is formed using silicon (Si) and a transistor whose semiconductor layer is formed using an oxide semiconductor (OS) has attracted attention (see Patent Documents 1 and 2).

In recent years, with the increase in the amount of data manipulated, a semiconductor device having a larger storage capacity has been required. To increase the storage capacity per unit area, it is effective to miniaturize a transistor and a capacitor included in a semiconductor device.

REFERENCE

Patent Document

[Patent Document 1] Japanese Published Patent Application No. 2013-008437
[Patent Document 2] Japanese Published Patent Application No. 2013-008436

SUMMARY OF THE INVENTION

However, miniaturization of elements included in a semiconductor device is accompanied by a decrease in the area of a capacitor, and therefore results in small storage capacity for holding data. With the small storage capacity, the parasitic capacitance of a transistor connected to the capacitor cannot be ignored and it is difficult to hold data and/or back up and recover data.

Thus, an object of one embodiment of the present invention is to provide a semiconductor device with a novel structure in which storage capacity needed for holding data can be secured even with miniaturized elements. The semiconductor device holds data by utilizing an extremely low off-state current of a transistor to make a capacitor hold charge. Another object of one embodiment of the present invention is to provide a semiconductor device with a novel structure in which on-state current of a transistor can be increased without complicating the manufacturing process, wirings of a circuit, or the operation of the semiconductor device. Another object of one embodiment of the present invention is to provide a novel semiconductor device or the like.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a semiconductor device including a plurality of memories. Each memory includes a volatile memory including a first data holding portion and a nonvolatile memory including a second data holding portion. The second data holding portion includes a first transistor and a first capacitor. One of a source and a drain of the first transistor is electrically connected to the first data holding portion. The other of the source and the drain of the first transistor is electrically connected to one electrode of the first capacitor. The one electrode of the first capacitor is provided in the same layer as electrodes serving as the source and the drain of the first transistor. The other electrode of the first capacitor is provided in the same layer as an electrode serving as a gate of the first transistor. A wiring that is provided between the plurality of memories and electrically connects the gates of the first transistors is provided in a layer different from a layer in which the other electrode of the first capacitor is provided.

In the semiconductor device of one embodiment of the present invention, it is preferable that in the second data holding portion, the first transistor be turned off and charge be held between the other of the source and the drain of the first transistor and the one electrode of the first capacitor, so that data stored in the first data holding portion is held.

In the semiconductor device of one embodiment of the present invention, a semiconductor layer of the first transistor is preferably an oxide semiconductor.

In the semiconductor device of one embodiment of the present invention, the first transistor is preferably a top-gate transistor.

In the semiconductor device of one embodiment of the present invention, it is preferable that the first data holding portion be a circuit including a second transistor whose semiconductor layer is silicon.

In the semiconductor device of one embodiment of the present invention, the first transistor is preferably stacked over the second transistor.

In the semiconductor device of one embodiment of the present invention, a wiring layer that electrically connects the first transistor and the second transistor is preferably provided between a layer in which the first transistor is provided and a layer in which the second transistor is provided.

Another embodiment of the present invention is a semiconductor device including a plurality of memories. Each memory includes a volatile memory including a first data holding portion and a second data holding portion and a nonvolatile memory including a third data holding portion and a fourth data holding portion. The third data holding portion includes a first transistor and a first capacitor. The fourth data holding portion includes a second transistor and a second capacitor. One of a source and a drain of the first transistor is electrically connected to the first data holding portion. The other of the source and the drain of the first transistor is electrically connected to one electrode of the first capacitor. One of a source and a drain of the second transistor is electrically connected to the second data holding portion. The other of the source and the drain of the second transistor is electrically connected to one electrode of the second capacitor. The one electrode of the first capacitor is provided in the same layer as electrodes serving as the source and the drain of the first transistor. The other electrode of the first capacitor and the other electrode of the second capacitor are provided in the same layer as an electrode serving as a gate of the first transistor and an electrode serving as a gate of the second transistor. A wiring that electrically connects the gate of the first transistor and the gate of the second transistor is provided in a layer different from a layer in which the other electrode of the first capacitor and the other electrode of the second capacitor are provided.

Another embodiment of the present invention is a semiconductor device including a plurality of memories. Each memory includes a volatile memory including a first data holding portion and a second data holding portion and a nonvolatile memory including a third data holding portion and a fourth data holding portion. The third data holding portion includes a first transistor and a first capacitor. The fourth data holding portion includes a second transistor and a second capacitor. One of a source and a drain of the first transistor is electrically connected to the first data holding portion. The other of the source and the drain of the first transistor is electrically connected to one electrode of the first capacitor. One of a source and a drain of the second transistor is electrically connected to the second data holding portion. The other of the source and the drain of the second transistor is electrically connected to one electrode of the second capacitor. The one electrode of the first capacitor is provided in the same layer as electrodes serving as the source and the drain of the first transistor. The other electrode of the first capacitor and the other electrode of the second capacitor are provided in the same layer as an electrode serving as a gate of the first transistor and an electrode serving as a gate of the second transistor. A wiring that electrically connects the gate of the first transistor and the gate of the second transistor is provided in a layer different from a layer in which the other electrode of the first capacitor and the other electrode of the second capacitor are provided. Channel formation regions of semiconductor layers of the first transistor and the second transistor each overlap with a wiring that supplies a high power supply potential.

In the semiconductor device of one embodiment of the present invention, it is preferable that in the third data holding portion, the first transistor be turned off and charge be held between the other of the source and the drain of the first transistor and the one electrode of the first capacitor, so that data stored in the first data holding portion is held, and that in the fourth data holding portion, the second transistor be turned off and charge be held between the other of the source and the drain of the second transistor and the one electrode of the second capacitor, so that data stored in the second data holding portion is held.

In the semiconductor device of one embodiment of the present invention, each of semiconductor layers of the first transistor and the second transistor is preferably an oxide semiconductor.

In the semiconductor device of one embodiment of the present invention, the first transistor and the second transistor are preferably top-gate transistors.

In the semiconductor device of one embodiment of the present invention, it is preferable that the first data holding portion and the second data holding portion each be a circuit including a third transistor whose semiconductor layer is silicon.

In the semiconductor device of one embodiment of the present invention, the first transistor and the second transistor are preferably stacked over the third transistor.

In the semiconductor device of one embodiment of the present invention, a wiring layer that electrically connects the first transistor, the second transistor, and the third transistor is preferably provided between a layer in which the first transistor and the second transistor are provided and a layer in which the third transistor is provided.

According to one embodiment of the present invention, a semiconductor device with a novel structure in which storage capacity needed for holding data can be secured even with miniaturized elements can be provided. The semiconductor device holds data by utilizing an extremely low off-state current of a transistor to make a capacitor hold charge. According to one embodiment of the present invention, a semiconductor device with a novel structure in which on-state current of a transistor can be increased without complicating the manufacturing process, wirings of a circuit, or the operation of the semiconductor device can be provided. Further, according to one embodiment of the present invention, a novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

DETAILED DESCRIPTION OF THE INVENTION

Figure 1A:
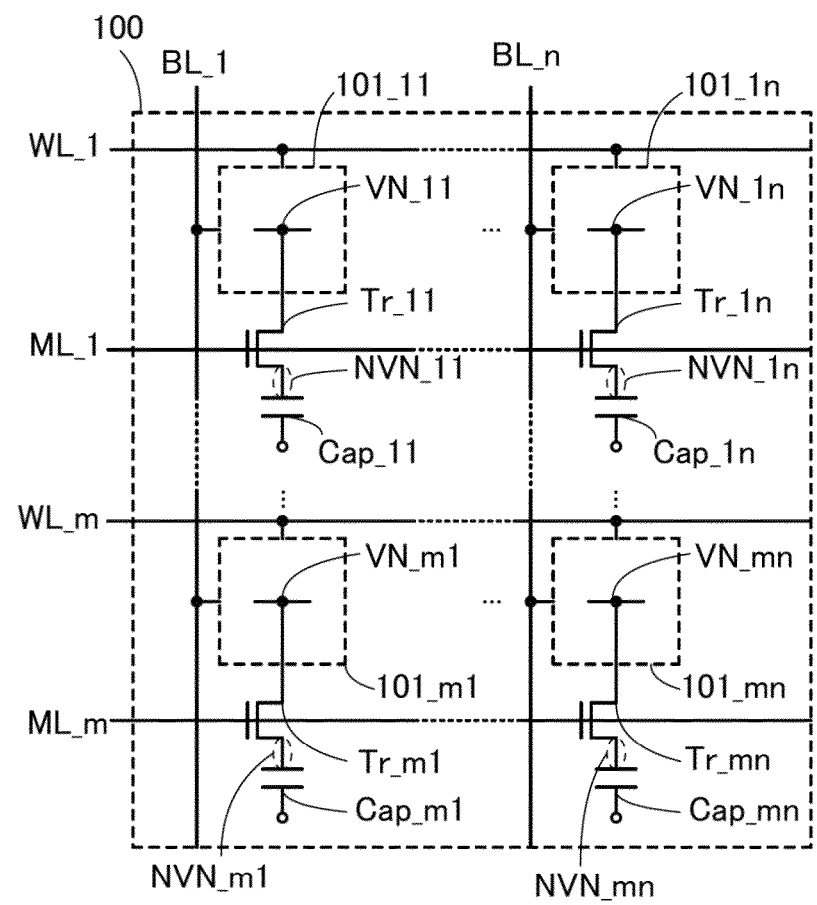
FIGS. 1A and 1B are a circuit diagram and a cross-sectional schematic view of a memory cell.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the phrase "A and B are connected" or "A is connected to B" means the case where A and B are electrically connected to each other as well as the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" and "below", are used for convenience for describing the positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

Note that the positional relationships of circuit blocks in diagrams are specified for description, and even in the case where different circuit blocks have different functions in the diagrams, the different circuit blocks might be provided in an actual circuit block so that different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

Note that a voltage refers to a potential difference between a given potential and a reference potential (e.g., a ground potential) in many cases. Therefore, a voltage, a potential, and a potential difference can also be referred to as a potential, a voltage, and a voltage difference, respectively. Note that a voltage refers to the difference between potentials of two points, and a potential refers to electrostatic energy (electric potential energy) of a unit charge at a given point in an electrostatic field.

Note that in general, potential and voltage are relative values. Therefore, ground potential is not always 0 V.

In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification and the like, trigonal and rhombohedral crystal systems are included in a hexagonal crystal system.

(Embodiment 1)

In this embodiment, a circuit configuration of a memory cell included in a semiconductor device of one embodiment of the disclosed invention and a cross-sectional schematic view thereof will be described with reference to FIGS. 1A and 1B.

Note that a semiconductor device refers to a device including a semiconductor element. The semiconductor device includes a driver circuit or the like for driving a circuit including a semiconductor element. Note that a semiconductor device includes a memory cell, and in some cases, further includes a driver circuit, a power supply circuit, or the like provided over a substrate which is different from a substrate provided with the memory cell.

FIG. 1A is a circuit diagram showing an example of a memory cell 100.

The memory cell 100 illustrated in FIG. 1A includes memory circuits 101_11 to 101_nm (m and n are natural numbers), transistors Tr_11 to Tr_mn, and capacitors Cap_11 to Cap_nm. Note that the memory circuit 101_nm, the transistor Tr_mn, and the capacitor Cap_nm are a circuit and elements that compose a memory and are arranged in the m-th row and the n-th column. A plurality of memories composed of the memory circuits 101_11 to 101_nm, the transistors Tr_11 to Tr_mn, and the capacitors Cap_11 to Cap_nm are provided in a matrix.

FIG. 1A also illustrates word lines WL_1 to WL_m, bit lines BL_1 to BL_n, and data control lines ML_1 to ML_m.

FIG. 1A illustrates volatile memory portions VN_11 to VN_nm, which correspond to nodes that hold potentials corresponding to data, in the memory circuits 101_11 to 101_nm. FIG. 1A also illustrates nonvolatile memory portions NVN_11 to NVN_nm that hold potentials corresponding to data, which correspond to the respective nodes between the transistors Tr_11 to Tr_mn and the capacitors Cap_11 to Cap_nm.

Note that in this specification, "node" refers to any point on a wiring provided to connect elements electrically.

In the semiconductor device described in this embodiment, one of the two electrodes of each of the capacitors Cap_11 to Cap_nm is an electrode provided in the same layer as an electrode serving as a gate of each of the transistors Tr_11 to Tr_mn, and the other is an electrode provided in the same layer as electrodes serving as a source and a drain of each of the transistors Tr_11 to Tr_nm. Further, a layer in which the electrode serving as a gate of each of the transistors Tr_11 to Tr_mn is provided (gate electrode layer) and a wiring layer connecting the gates of the transistors Tr_11 to Tr_mn in the plurality of memories (memory cell wiring layer) are provided in different layers.

In the structure described in this embodiment, since the gate electrode layer and the memory cell wiring layer are provided in different layers, parasitic capacitance formed around the gates of the transistors Tr_11 to Tr_mn can be reduced. Further, since the gate electrode layer and the memory cell wiring layer are provided in different layers, each of the capacitors Cap_11 to Cap_nm, one electrode of which is provided in the same layer as the gate electrode layer, can be formed in a larger area.

Next, circuits included in the memory cell 100 are described.

The memory circuits 101_11 to 101_nm are circuits in which potentials corresponding to data supplied to the bit lines BL_1 to BL_n are written in accordance with word signals supplied to the word lines WL_1 to WL_m. For example, the memory circuits 101_11 to 101_nm are circuits that each function as a static random access memory (SRAM) when the transistors Tr_11 to Tr_mn are off. Specifically, each of the memory circuits 101_11 to 101_nm can be composed of two transistors and two inverter circuits.

The volatile memory portions VN_11 to VN_nm are nodes that hold potentials corresponding to data when power is supplied to the memory circuits 101_11 to 101_nm. In the case where the memory circuits 101_11 to 101_nm each function as an SRAM, at least one of nodes to which output signals of the two inverter circuits are output corresponds to one of the volatile memory portions VN_11 to VN_nm.

Note that in this specification, "data is written" means that a signal is controlled so that the potential of a wiring changes in accordance with the potential of another wiring. For example, "data is written in the memory circuits 101_11 to 101_1n" means that a word signal supplied to the word line WL_1 is controlled so that the potentials of the volatile memory portions VN_11 to VN_1n become the potentials of the bit lines BL_1 to BL_n.

The transistors Tr_11 to Tr_mn function as switches for controlling data writing to the nonvolatile memory portions NVN_11 to NVN_nm. Each of the transistors Tr_11 to Tr_mn can be switched between an on state and an off state by a signal supplied to the gate. The transistors Tr_11 to Tr_nm also enable written data to be held by keeping an off state. Note that the transistors Tr_11 to Tr_nm are also referred to as first transistors. Further, the transistors Tr_11 to Tr_nm are n-channel transistors in the following description.

Note that, as each of the transistors Tr_11 to Tr_nm, it is preferable to use a transistor having a low current that flows between a source and a drain in an off state (low off-state current). Here, the "low off-state current" means that the normalized off-state current per micrometer of a channel width with a drain-source voltage of 10 V at room temperature is less than or equal to 10 zA. An example of a transistor having such a low off-state current is a transistor including an oxide semiconductor as a semiconductor layer.

The capacitors Cap_11 to Cap_nm are capacitors in which data in the volatile memory portions VN_11 to VN_nm are written when the transistors Tr_11 to Tr_nm are turned on. Further, the capacitors Cap_11 to Cap_nm are capacitors that hold charge even without external power supply when the transistors Tr_11 to Tr_nm are off. When the transistors Tr_11 to Tr_nm are turned on, data held in the capacitors Cap_11 to Cap_nm are written in the volatile memory portions VN_11 to VN_nm.

The data control lines ML_1 to ML_m are wirings to which signals for switching the transistors Tr_11 to Tr_nm between an on state and an off state are supplied. When an H-level signal is supplied to one of the data control lines ML_1 to ML_m (e.g., the data control line ML_1), the transistors Tr_11 to Tr_1n connected to the selected data control line are turned on, and when an L-level signal is supplied, the transistors Tr_11 to Tr_1n connected to the selected data control line are turned off.

The nonvolatile memory portions NVN_11 to NVN_nm are the nodes between the transistors Tr_11 to Tr_nm and the capacitors Cap_11 to Cap_nm. When the transistors Tr_11 to Tr_nm are off, charge held in the capacitors Cap_11 to Cap_nm hardly leaks through the transistors Tr_11 to Tr_nm. Owing to this small leakage, data in the volatile memory portions VN_11 to VN_nm can continue to be stored in the nonvolatile memory portions NVN_11 to NVN_nm even when power supply is stopped.

In the configuration of the nonvolatile memory portions NVN_11 to NVN_nm shown in FIG. 1A, written data is held by keeping the transistors Tr_11 to Tr_mn in an off state. Thus, as described above, it is particularly preferable to use a transistor with a low off-state current as a switch for reducing potential fluctuations accompanied by transfer of charge in each of the nonvolatile memory portions NVN_11 to NVN_nm.

When a transistor having a low off-state current is used as each of the transistors Tr_11 to Tr_mn and the transistors Tr_11 to Tr_nm are kept in an off state, the nonvolatile memory portions NVN_11 to NVN_nm can be nonvolatile memories. Thus, once data is written in the nonvolatile memory portions NVN_11 to NVN_nm, the data can be held in the nonvolatile memory portions NVN_11 to NVN_nm until the transistors Tr_11 to Tr_nm are turned on again.

Next, the cross-sectional schematic view of the transistors Tr_11 to Tr_mn and the capacitors Cap_11 to Cap_nm in the memory cell 100 shown in FIG. 1A is described with reference to FIG. 1B, and further, the action and effect of the structure in this embodiment are described. Note that FIG. 1B illustrates the transistor Tr as one of the transistors Tr_11 to Tr_mn and the capacitor Cap as one of the capacitors Cap_11 to Cap_nm.

Figure 1B:
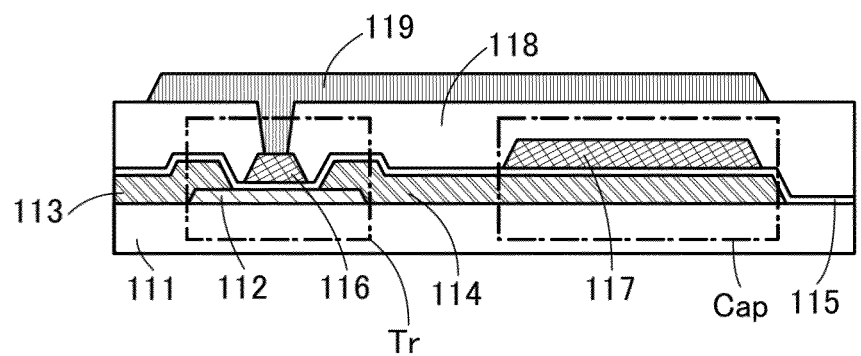

The cross-sectional schematic view in FIG. 1B shows the cross-sectional structures of the transistor Tr and the capacitor Cap. Note that the transistor Tr and the capacitor Cap in FIG. 1B are provided over the transistors composing the memory circuits 101_11 to 101_nm described with reference to FIG. 1A and wirings for connecting the transistors.

The structure in FIG. 1B illustrating the transistor Tr and the capacitor Cap includes an insulating layer 111, a semiconductor layer 112, a first electrode 113 serving as one of a source and a drain, a second electrode 114 serving as the other of the source and the drain, a gate insulating layer 115, a gate electrode 116, an electrode 117 provided in the same layer as the gate electrode 116, an interlayer insulating layer 118, and a wiring layer 119.

As shown in FIG. 1B, in the semiconductor device described in this embodiment, electrodes of the capacitor Cap are an electrode provided in the same layer as the gate electrode 116 of the transistor Tr and an electrode provided in the same layer as the second electrode 114 serving as the other of the source and the drain of the transistor Tr. Further, a layer in which the gate electrode 116 is provided and the wiring layer 119 connecting the gate electrodes 116 of the transistors Tr in the plurality of memories are provided in different layers.

In the structure described in this embodiment, since the gate electrode 116 and the wiring layer 119 are provided in different layers, parasitic capacitance formed around the gate electrode 116 of the transistor Tr can be reduced. Further, since the layer in which the gate electrode 116 of the transistor Tr is provided and the wiring layer 119 can be provided in different layers, the capacitor Cap, one electrode of which is provided in the same layer as the gate electrode 116, can be formed in a larger area.

Next, components shown in the cross-sectional schematic view in FIG. 1B are described.

The insulating layer 111 can be, for example, an inorganic insulating layer. The inorganic insulating layer preferably has a single-layer structure or a layered structure including any of a silicon nitride film, a silicon oxynitride film, a silicon nitride oxide film, and the like. Although omitted in FIG. 1B, a transistor and a wiring layer that is formed using a conductive layer are provided below the insulating layer 111. Further, a conductive layer for electrically connecting an element provided over the insulating layer 111 to an element provided below the insulating layer 111 may be provided in the insulating layer 111.

An oxide semiconductor is preferably used for the semiconductor layer 112 so that the transistor Tr has a low current that flows between the source and the drain in an off state (low off-state current).

The first electrode 113 and the second electrode 114 serving as the source and the drain can be, for example, a single layer or a stacked layer formed using a metal material such as aluminum, copper, titanium, tantalum, or tungsten.

Like the insulating layer 111, the gate insulating layer 115 can be an inorganic insulating layer.

Like the first electrode 113 and the second electrode 114, the gate electrode 116 and the electrode 117 provided in the same layer as the gate electrode 116 can be a single layer or a stacked layer formed using a metal material such as aluminum, copper, titanium, tantalum, or tungsten.

The interlayer insulating layer 118 is preferably a single layer or a multilayer including an inorganic insulating layer or an organic insulating layer. The organic insulating layer is preferably a single layer or a multilayer formed using polyimide, acrylic, or the like.

Like the gate electrode 116, the electrode 117, the first electrode 113, and the second electrode 114, the wiring layer 119 can be a single layer or a stacked layer formed using a metal material such as aluminum, copper, titanium, tantalum, or tungsten.

In the structure in the cross-sectional schematic view in FIG. 1B, the capacitor Cap is a capacitor in which the gate insulating layer 115 is formed between the second electrode 114 and the electrode 117. The gate insulating layer 115 is thinner than the interlayer insulating layer 118. Thus, the capacitor Cap can have large capacitance as compared with a capacitor with the same area that is formed using the interlayer insulating layer 118.

Further, in the structure in the cross-sectional schematic view in FIG. 1B, the wiring layer 119 connecting the gate electrodes 116 of the transistors Tr in the plurality of memories and the gate electrode 116 are provided in different layers. Thus, the wiring layer 119 can be provided apart from other conductive layers. Consequently, parasitic capacitance formed around the wiring layer 119 can be reduced, and parasitic capacitance formed around the gate of the transistor Tr can be reduced as compared with the case where the gate electrodes 116 of the transistors Tr in the plurality of memories are connected to one another in the same layer as the gate electrode 116.

Furthermore, in the structure in the cross-sectional schematic view in FIG. 1B, the gate electrodes 116 of the transistors Tr in the plurality of memories are connected to one another in a layer different from the layer in which the gate electrode 116 is provided. In this structure, it is not necessary to connect the gate electrodes 116 of the transistors Tr in the plurality of memories in the same layer as the gate electrode 116, and accordingly the area occupied by the capacitor Cap can be increased.

In the case where, conversely to the structure in the cross-sectional schematic view in FIG. 1B, the gate electrodes 116 of the transistors Tr in the plurality of memories are connected to one another in the same layer as the gate electrode 116, it is necessary to provide the gate electrode 116 and the electrode 117 in the same layer apart from each other to prevent a short circuit therebetween. Accordingly, the area occupied by the capacitor Cap is reduced. Thus, in that case, the capacitance of the capacitor Cap becomes small and the parasitic capacitance of the transistor Tr cannot be ignored, and therefore it is difficult to hold data and/or back up and recover data.

Next, a specific circuit configuration of the memory cell 100 and the operation thereof will be described with reference to FIGS. 2A and 2B, FIG. 3, FIG. 4, and FIGS. 5A and 5B.

Figure 2A:
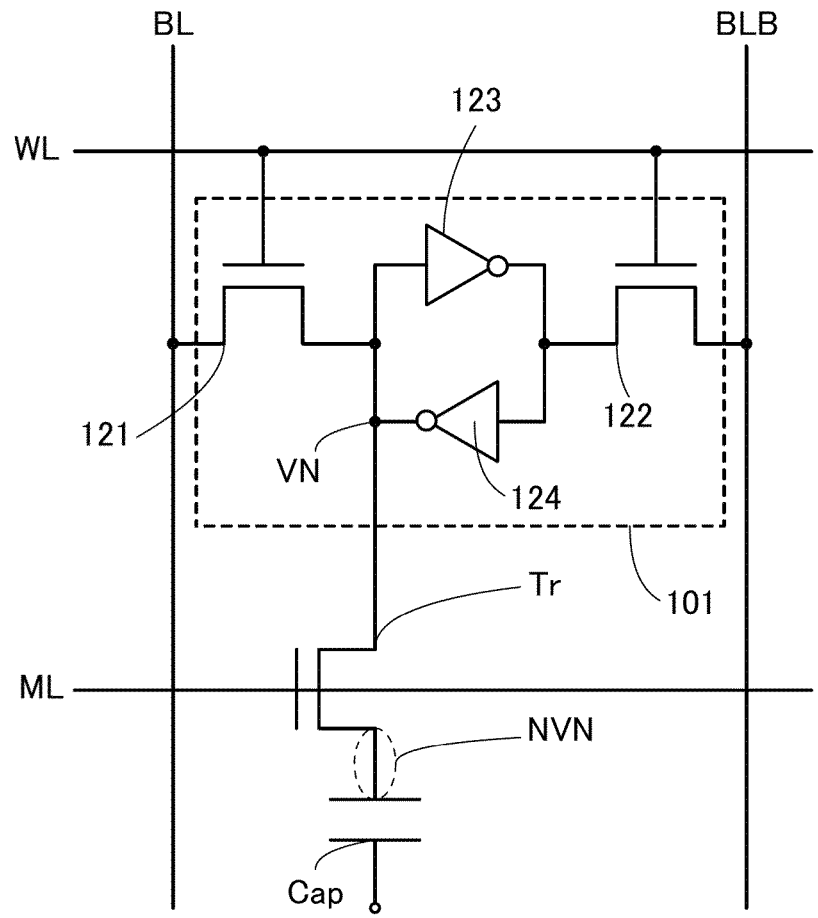
FIG. 2A is a circuit diagram of a memory cell.

FIG. 2A illustrates a specific circuit configuration of a unit memory cell included in the memory cell 100 in FIG. 1A.

As in FIG. 1A, the memory circuit 101, the transistor Tr, and the capacitor Cap are shown in FIG. 2A.

FIG. 2A also illustrates the word line WL, the bit line BL, an inverted bit line BLB, and the data control line ML.

In addition, FIG. 2A illustrates a transistor 121, a transistor 122, an inverter circuit 123, and an inverter circuit 124 that compose an SRAM in the memory circuit 101. In the memory circuit 101, a node to which an output signal of the inverter circuit 124 is output is shown as the volatile memory portion VN.

Note that the transistor 121, the transistor 122, and transistors included in the inverter circuit 123 and the inverter circuit 124 are preferably transistors that include silicon in channels. Transistors including silicon in channels are particularly preferable when the transistors are stacked together with the transistor Tr, which is a transistor including an oxide semiconductor in a semiconductor layer, and the capacitor Cap.

As in FIG. 1A, the nonvolatile memory portion NVN that holds a potential corresponding to data, which corresponds to the node between the transistor Tr and the capacitor Cap, is shown in FIG. 2A.

The configuration of the unit memory cell in FIG. 2A is similar to the configuration shown in FIGS. 1A and 1B.

Next, the operation of the unit memory cell is described.

Figure 2B:
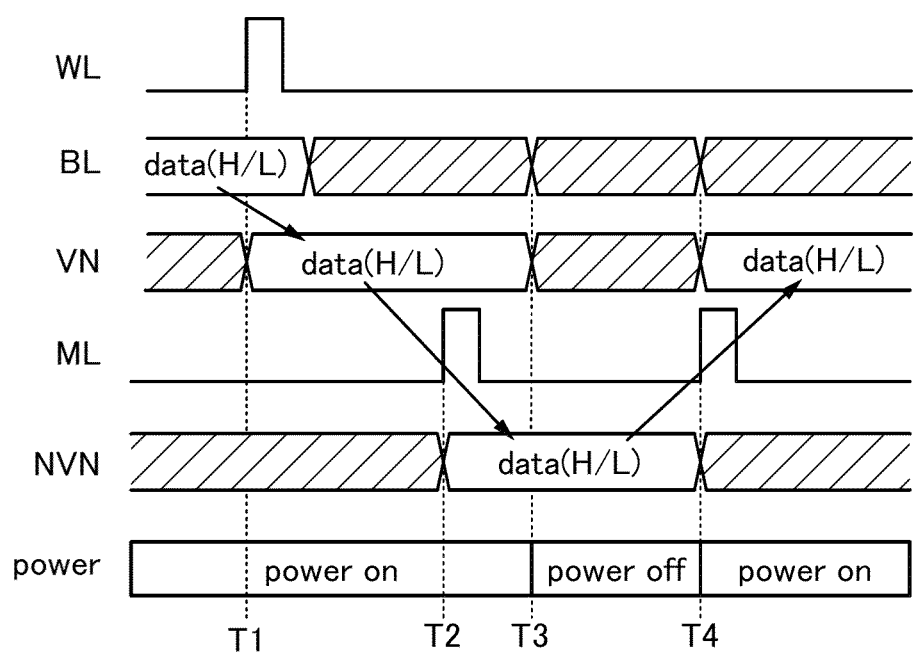
FIG. 2B is a timing chart of the memory cell.

The timing chart in FIG. 2B shows the potentials of the word line WL, the bit line BL, the volatile memory portion VN, the data control line ML, and the nonvolatile memory portion NVN shown in FIG. 2A, and also shows whether power is supplied or not (indicated by "power" in the drawing). Note that in FIG. 2B, hatched portions indicate supply of signals. Description on operations corresponding to the portions is omitted because it is unnecessary here.

First, at time T1, a word signal supplied to the word line WL is set at H level, so that data (denoted by data(H/L) in the drawing) corresponding to an H-level or L-level potential supplied to the bit line BL is written in the volatile memory portion VN. Data corresponding to the potential opposite to that of the bit line BL is supplied to the inverted bit line BLB.

Then, at time T2, a signal supplied to the data control line ML is set at H level, so that the data having been written in the volatile memory portion VN is written in the nonvolatile memory portion NVN. Note that the data writing to the nonvolatile memory portion NVN at time T2 is also referred to as data backup.

Next, at time T3, power supply is stopped. At this time, the data having been written in the volatile memory portion VN is lost, whereas the data having been written in the nonvolatile memory portion NVN can be held by turning off the transistor Tr with a low off-state current.

Then, at time T4, power supply is resumed. Then, the data held in the nonvolatile memory portion NVN is rewritten in the volatile memory portion VN. The data writing to the volatile memory portion VN is performed with a signal supplied to the data control line ML set at H level. Note that the data writing to the volatile memory portion VN at time T4 is also referred to as data recovery.

Figure 3:
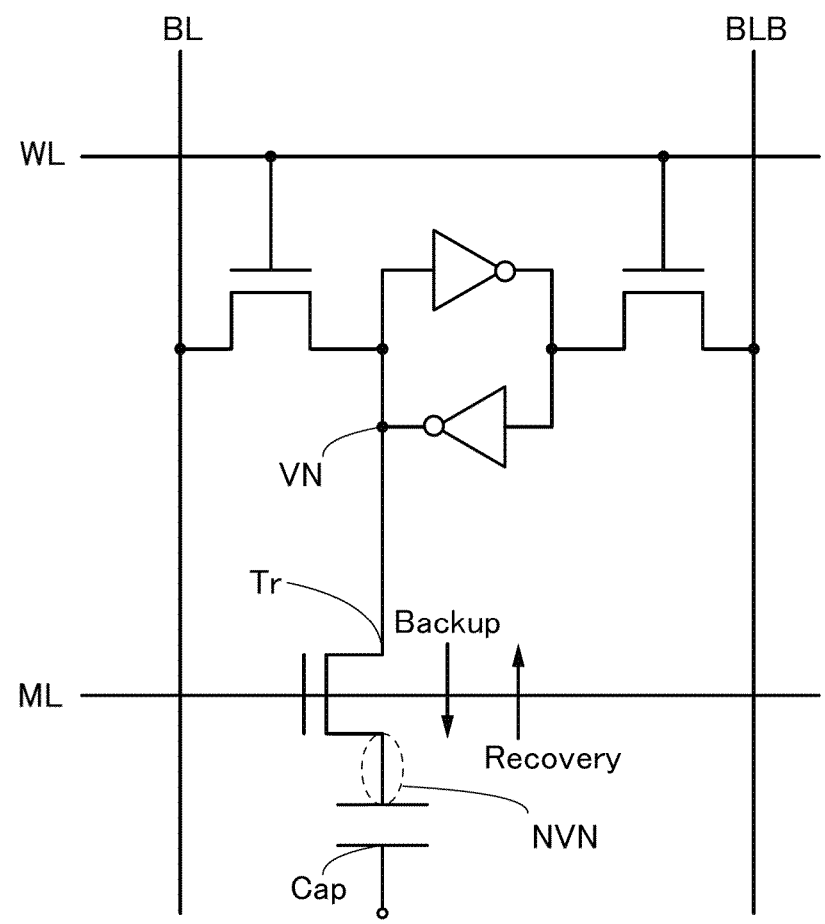
FIG. 3 is a circuit diagram of a memory cell.

The backup and recovery of data described with reference to FIG. 2B can be schematically shown on a circuit diagram in FIG. 3. In both the data backup and data recovery operations described with reference to FIG. 2B and FIG. 3, an H-level signal is supplied to the data control line ML to turn on the transistor Tr.

When parasitic capacitance between the gate and the source and between the gate and the drain of the transistor Tr is too large to be ignorable as compared with the capacitance of the capacitor Cap, the potentials of the volatile memory portion VN and the nonvolatile memory portion NVN fluctuate in accordance with fluctuations of the potential of the data control line ML. Fluctuations of the potentials of the volatile memory portion VN and the nonvolatile memory portion NVN during the data backup and data recovery operations make normal operation difficult.

In other words, when parasitic capacitance between the gate and the source and between the gate and the drain of the transistor Tr is small enough to be ignorable as compared with the capacitance of the capacitor Cap, the potentials of the volatile memory portion VN and the nonvolatile memory portion NVN do not fluctuate even if the potential of the data control line ML fluctuates.

In the structure in this embodiment, as described above, the wiring layer connecting the gate electrodes of the transistors Tr in the plurality of memories and the gate electrode are provided in different layers. Consequently, the wiring layer can be provided apart from other conductive layers and parasitic capacitance formed around the gate of the transistor Tr can be reduced. Reducing parasitic capacitance can reduce fluctuations of the potentials of the volatile memory portion VN and the nonvolatile memory portion NVN during the data backup and data recovery operations and thus enables normal operation.

Figure 4:
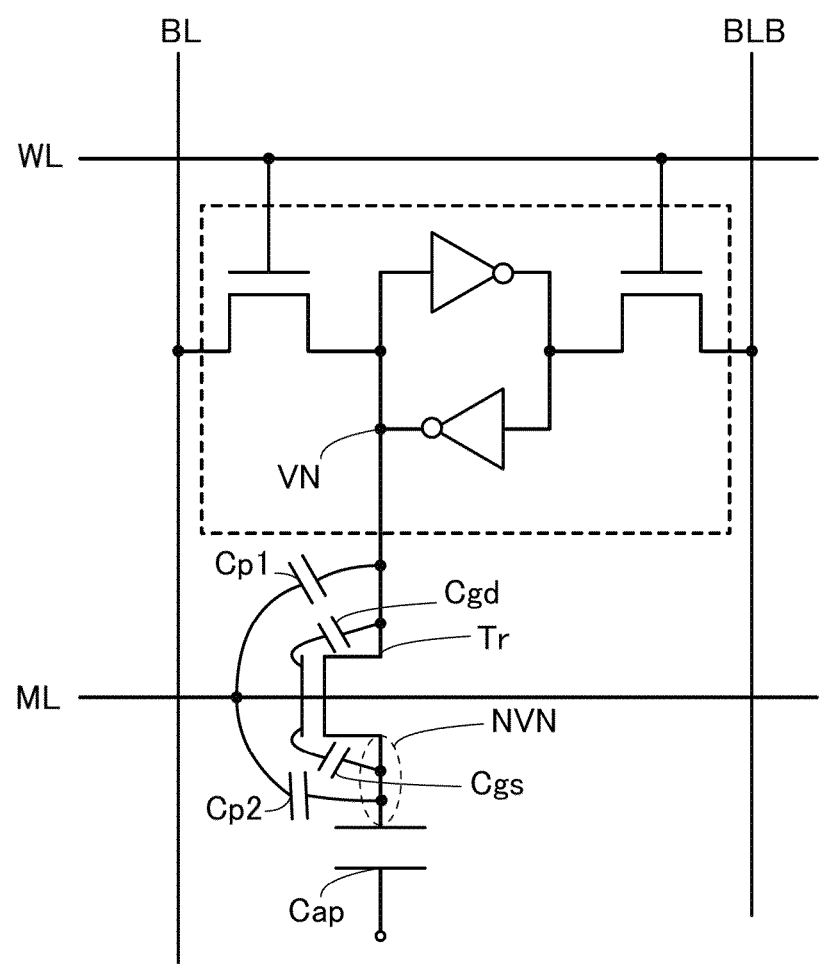
FIG. 4 is a circuit diagram of a memory cell.

FIG. 4 schematically shows parasitic capacitance Cgs between the gate and the source of the transistor Tr, parasitic capacitance Cgd between the gate and the drain of the transistor Tr, parasitic capacitance Cp1 between a wiring layer and the source of the transistor Tr, and parasitic capacitance Cp2 between the wiring layer and the drain of the transistor Tr in a circuit diagram. In the description of FIG. 4, one of the source and the drain is referred to as "source" and the other is referred to as "drain".

The wiring layer provided in the direction in which the data control line ML extends is provided apart from other conductive layers, whereby the parasitic capacitance Cp1 and the parasitic capacitance Cp2 in the circuit diagram in FIG. 4 can be reduced.

Figure 5A:
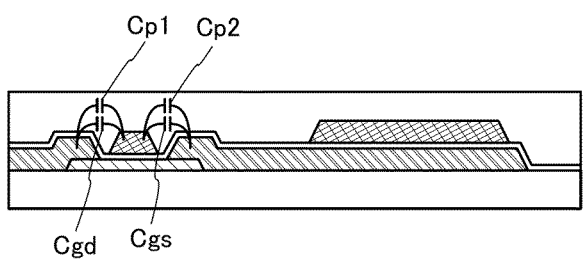
FIGS. 5A and 5B are cross-sectional schematic views of memory cells.
Figure 5B:
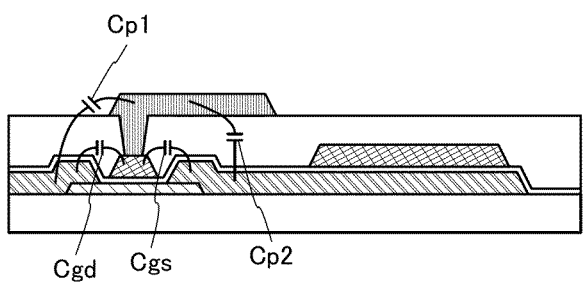

For example, when the wiring layer is in the same layer as the gate electrode of the transistor as in the cross-sectional schematic view in FIG. 5A, the wiring layer forms the parasitic capacitance Cp1 and the parasitic capacitance Cp2 with another layer with an insulating layer thinner than other insulating layers, such as the gate insulating layer, provided therebetween. On the other hand, when the wiring layer and the gate electrode of the transistor are in different layers as in the cross-sectional schematic view in FIG. 5B, the wiring layer forms the parasitic capacitance Cp1 and the parasitic capacitance Cp2 with another layer with an insulating layer thicker than other insulating layers, such as the interlayer insulating layer, provided therebetween. Accordingly, parasitic capacitance can be made smaller in the structure in FIG. 5B than that in the structure in FIG. 5A.

Further, the wiring layer provided in the direction in which the data control line ML extends and an electrode of the capacitor that is in the same layer as the gate electrode of the transistor Tr are provided in different layers, whereby the area occupied by the capacitor Cap in the circuit diagram in FIG. 4 can be increased. Consequently, the structure in this embodiment achieves a reduction in parasitic capacitance of the transistor and an increase in capacitance of the capacitor, and thereby reduces fluctuations of the potentials of the volatile memory portion VN and the nonvolatile memory portion NVN during the data backup and data recovery operations and enables normal operation.

The structure in this embodiment described above not only reduces parasitic capacitance formed around the gate of the transistor Tr, but also increases the area occupied by the capacitor because the gate electrodes of the transistors Tr in a plurality of memories are not connected to one another in the same layer as the gate electrode. Therefore, even with miniaturized transistors and capacitors, a reduction in parasitic capacitance and an increase in the area for the capacitor can be achieved, so that fluctuations of the potentials of the volatile memory portion VN and the nonvolatile memory portion NVN can be reduced.

The structure described in this embodiment can be used in appropriate combination with the structure described in any of the other embodiments.

(Embodiment 2)

In this embodiment, a cross-sectional structure of a transistor included in a memory cell of a semiconductor device of one embodiment of the disclosed invention will be described with reference to circuit diagrams, top views, and the like. In this embodiment, to describe the advantages of providing the wiring layer connecting the gate electrodes of the transistors Tr in the plurality of memories and the gate electrode in different layers, a structure in which the wiring layer and the gate electrode are in the same layer and a structure in which they are in different layers are described with reference to top views and cross-sectional views.

Figure 6:
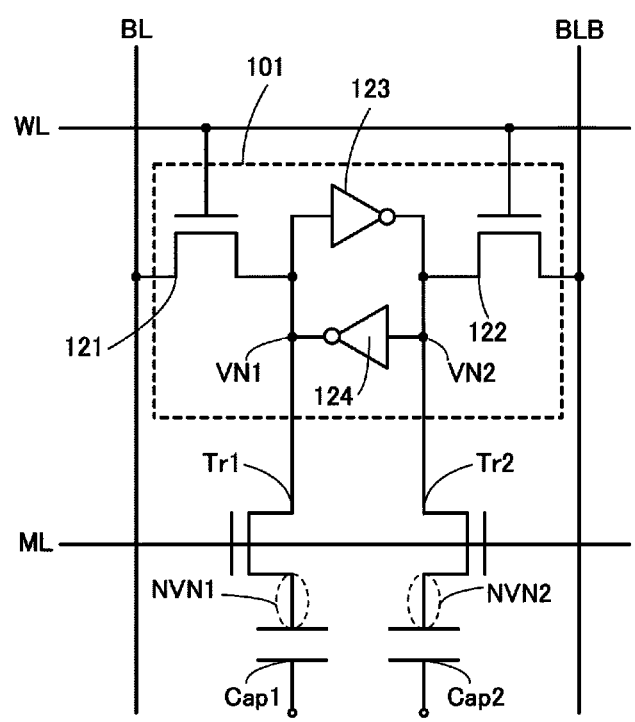
FIG. 6 is a circuit diagram of a memory cell.

First, a circuit configuration of a memory cell described as an example in this embodiment is shown in FIG. 6. The structure in which the wiring layer and the gate electrode are in the same layer and the structure in which they are in different layers both have the circuit configuration in FIG. 6.

FIG. 6 illustrates the memory circuit 101, a transistor Tr1, a transistor Tr2, a capacitor Cap1, and a capacitor Cap2.

FIG. 6 also illustrates the word line WL, the bit line BL, the inverted bit line BLB, and the data control line ML.

In addition, like FIG. 2A, FIG. 6 illustrates the transistor 121, the transistor 122, the inverter circuit 123, and the inverter circuit 124 that compose an SRAM in the memory circuit 101. In the memory circuit 101, a node to which an output signal of the inverter circuit 124 is output is shown as a volatile memory portion VN1. In the memory circuit 101, a node to which an output signal of the inverter circuit 123 is output is shown as a volatile memory portion VN2.

FIG. 6 illustrates a nonvolatile memory portion NVN1 that holds a potential corresponding to data, which corresponds to the node between the transistor Tr1 and the capacitor Cap1. FIG. 6 also illustrates a nonvolatile memory portion NVN2 that holds a potential corresponding to data, which corresponds to the node between the transistor Tr2 and the capacitor Cap2.

Next, top views, which correspond to the circuit configuration in FIG. 6, showing the structure where the wiring layer and the gate electrode are in the same layer are shown in FIG. 7A and FIGS. 8A to 8C. FIGS. 9A and 9B are cross-sectional views taken along dashed-dotted lines B-B' and C-C' in FIG. 7A and FIGS. 8A to 8C.

Figure 7A:
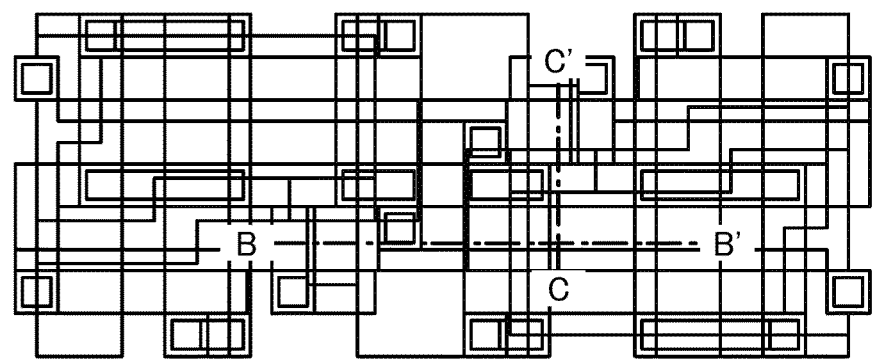
FIGS. 7A and 7B are a top view and a cross-sectional schematic view of a memory cell.

The top view in FIG. 7A shows the arrangement of the transistors 121 and 122, the inverter circuits 123 and 124, the transistors Tr1 and Tr2, and the capacitors Cap1 and Cap2 in the circuit diagram in FIG. 6.

Figure 7B:
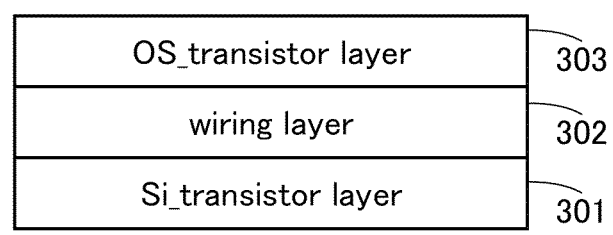

FIG. 7B is a schematic view showing the layer structures of the elements in FIG. 7A for easy understanding of the arrangement of the transistors in FIG. 7A. A first layer 301 in FIG. 7B is a layer in which a transistor including silicon in a semiconductor layer is provided ("Si_transistor layer" in the drawing). A second layer 302 in FIG. 7B is a layer in which a wiring layer for supplying power is provided ("wiring layer" in the drawing). A third layer 303 in FIG. 7B is a layer in which a transistor including an oxide semiconductor in a semiconductor layer is provided ("OS_transistor layer" in the drawing).

The first layer 301 in FIG. 7B includes transistors each including silicon in a semiconductor layer, i.e., the transistor 121 (SW1) and the transistor 122 (SW2), the inverter circuit 123 (INV1), and the inverter circuit 124 (INV2). The second layer 302 in FIG. 7B includes a wiring layer serving as wirings GND that supply ground potential, the bit line BL, a wiring VIL that supplies high power supply potential, and the inverted bit line BLB. The third layer 303 in FIG. 7B includes transistors each including an oxide semiconductor in a semiconductor layer, i.e., the transistors Tr1 (OS1) and Tr2 (OS2), and the capacitors Cap1 and Cap2.

Figure 8A:
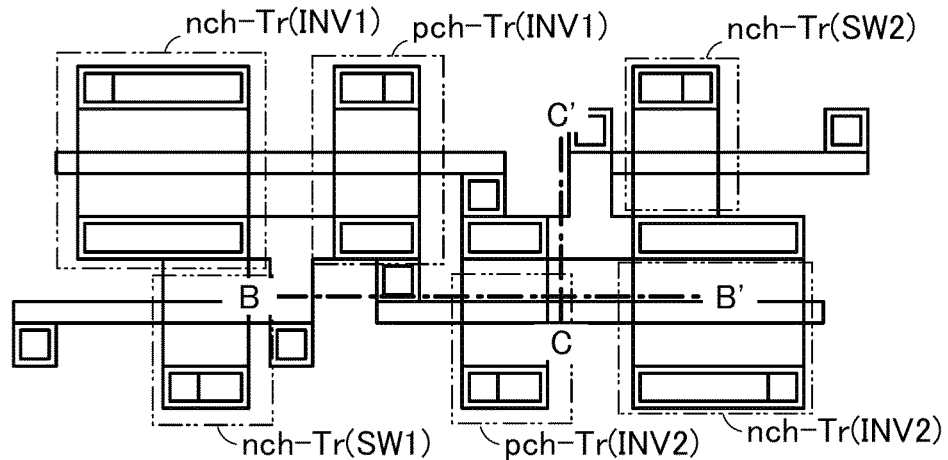
FIGS. 8A to 8C are top views of a memory cell.
Figure 9A:
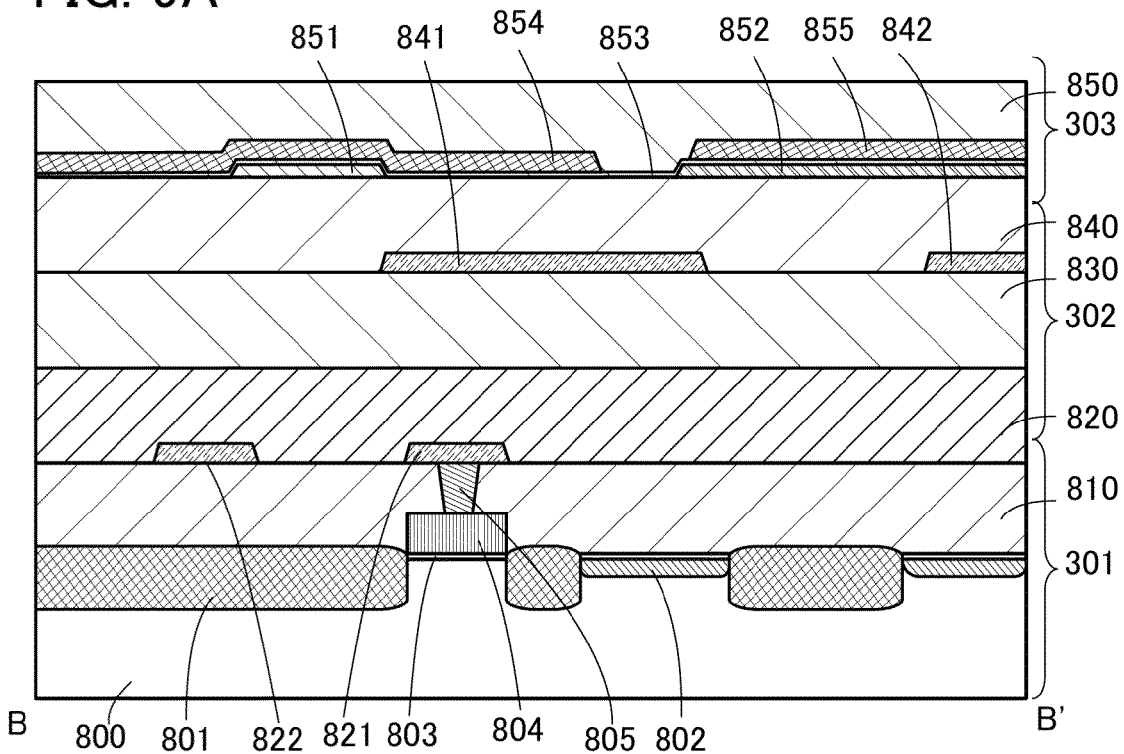
FIGS. 9A and 9B are cross-sectional views of a memory cell.
Figure 9B:
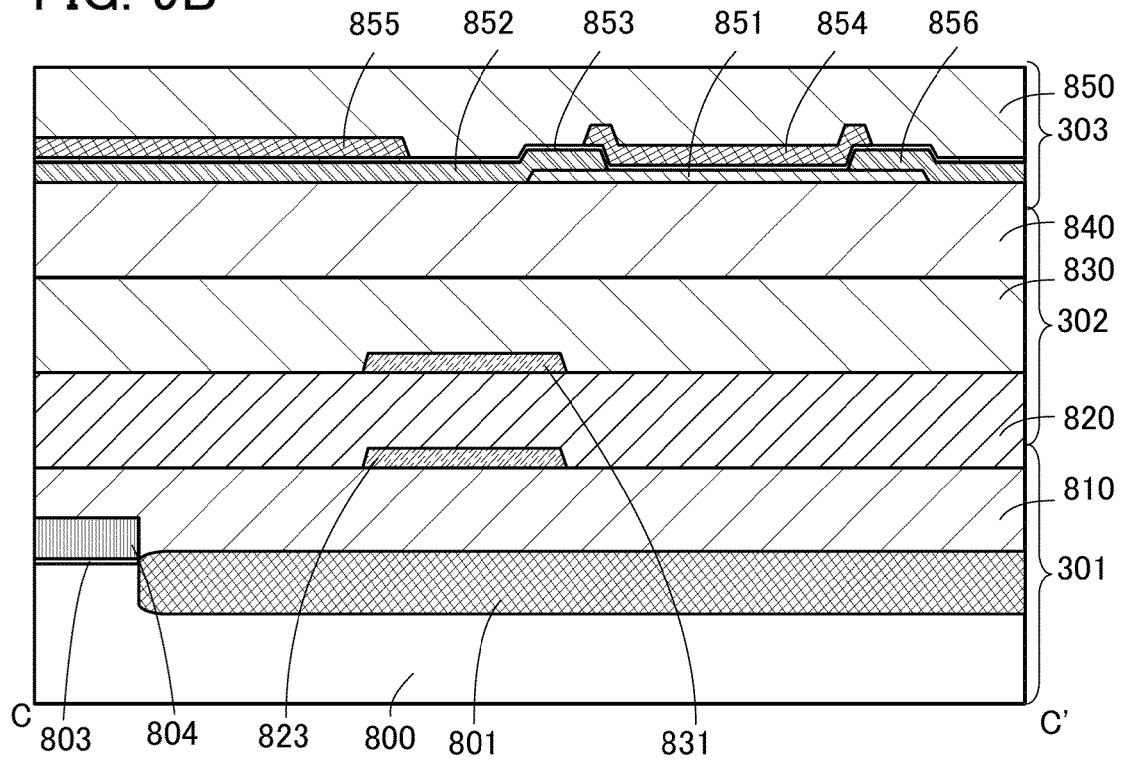

FIG. 8A is a top view of the first layer 301 in FIG. 7B. The top view in FIG. 8A shows the arrangement of a semiconductor layer, a wiring layer provided in the same layer as a gate electrode, a wiring layer provided in the same layer as a source electrode and a drain electrode, and openings for connecting the layers, which are included in the transistors each including silicon in a semiconductor layer.

The top view in FIG. 8A shows the arrangement of an n-channel transistor serving as the transistor 121 (nch-Tr (SW1)), an n-channel transistor serving as the transistor 122 (nch-Tr(SW2)), a p-channel transistor (pch-Tr(INV1)) and an n-channel transistor (nch-Tr(INV1)) included in the inverter circuit 123, and a p-channel transistor (pch-Tr(INV2)) and an n-channel transistor (nch-Tr(INV2)) included in the inverter circuit 124.

Figure 8B:
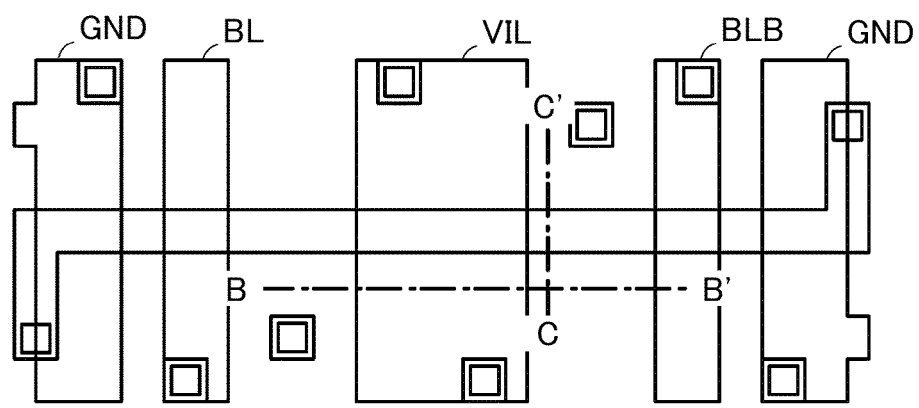

FIG. 8B is a top view of the second layer 302 in FIG. 7B. The top view in FIG. 8B shows the arrangement of wiring layers provided in a plurality of layers and openings for connecting the layers.

The top view in FIG. 8B shows the arrangement of the wirings GND that supply ground potential, the bit line BL, the wiring VIL that supplies high power supply potential, and the inverted bit line BLB.

Figure 8C:
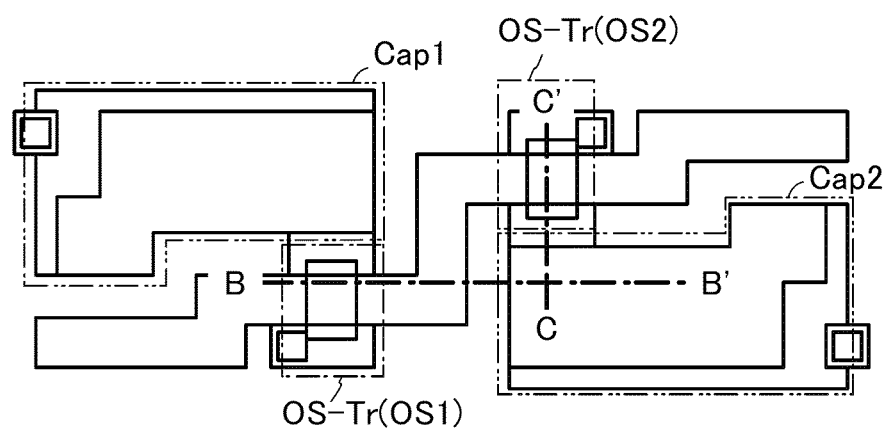

FIG. 8C is a top view of the third layer 303 in FIG. 7B. The top view in FIG. 8C shows the arrangement of a semiconductor layer, a wiring layer provided in the same layer as a gate electrode, a wiring layer provided in the same layer as a source electrode and a drain electrode, and openings for connecting the layers, which are included in the transistors each including an oxide semiconductor in a semiconductor layer.

The top view in FIG. 8C shows the arrangement of an n-channel transistor serving as the transistor Tr1 (OS-Tr (OS1)), an n-channel transistor serving as the transistor Tr2 (OS-Tr(OS2)), the capacitors Cap1 and Cap2, and openings for connecting the layers.

FIG. 9A is a cross-sectional view taken along dashed-dotted line B-B' in FIG. 7A and FIGS. 8A to 8C, and FIG. 9B is a cross-sectional view taken along dashed-dotted line C-C' in FIG. 7A and FIGS. 8A to 8C.

In this embodiment, the transistor in the first layer 301 is formed in a single crystal silicon substrate, the wiring layer in the second layer 302 is formed over the first layer 301, and the transistor in the third layer 303 is formed over the second layer 302. The transistor in the first layer 301 may include a thin semiconductor layer of silicon, germanium, or the like in an amorphous, microcrystalline, polycrystalline, or single crystal state.

FIG. 9A shows a semiconductor substrate 800, an element isolation insulating film 801, an impurity region 802, a gate insulating layer 803, a gate electrode 804, a wiring layer 805, an interlayer insulating layer 810, a wiring layer 821, a wiring layer 822, an interlayer insulating layer 820, an interlayer insulating layer 830, an interlayer insulating layer 840, a wiring layer 841, a wiring layer 842, an interlayer insulating layer 850, a semiconductor layer 851, a conductive layer 852, a gate insulating layer 853, a conductive layer 854, and a conductive layer 855.

FIG. 9B shows the semiconductor substrate 800, the element isolation insulating film 801, the gate insulating layer 803, the gate electrode 804, a wiring layer 823, the interlayer insulating layer 810, the interlayer insulating layer 820, the interlayer insulating layer 830, a wiring layer 831, the interlayer insulating layer 840, the interlayer insulating layer 850, the semiconductor layer 851, the conductive layer 852, the gate insulating layer 853, the conductive layer 854, the conductive layer 855, and a conductive layer 856.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistor in the first layer 301 is electrically isolated from another transistor by the element isolation insulating film 801. The element isolation insulating film 801 can be formed by a local oxidation of silicon (LOCOS) method, a trench isolation method, or the like.

The impurity region 802 is formed in such a manner that an impurity element imparting p-type conductivity or an impurity element imparting n-type conductivity is added to the semiconductor substrate 800 by using an ion doping method, an ion implantation method, or the like as appropriate.

The gate insulating layer 803 is formed in such a manner that the surface of the semiconductor substrate 800 is oxidized by heat treatment, so that a silicon oxide film is formed, and then the silicon oxide film is selectively etched. Alternatively, the gate insulating layer 803 is formed in such a manner that silicon oxide, silicon oxynitride, a metal oxide such as hafnium oxide, which is a high dielectric constant material (also referred to as a high-k material), or the like is formed by a CVD method, a sputtering method, or the like and then is selectively etched.

Each of the gate electrode 804, the wiring layers 805, 821, 822, 823, 831, 841, and 842, and the conductive layers 852, 854, 855, and 856 is preferably formed using a metal material such as aluminum, copper, titanium, tantalum, or tungsten. Alternatively, polycrystalline silicon to which an impurity such as phosphorus is added can be used. As the formation method, a variety of film formation methods such as an evaporation method, a PE-CVD method, a sputtering method, and a spin coating method can be used.

Each of the interlayer insulating layers 810, 820, 830, 840, and 850 is preferably a single layer or a multilayer including an inorganic insulating layer or an organic insulating layer. The inorganic insulating layer preferably has a single-layer structure or a layered structure including any of a silicon nitride film, a silicon oxynitride film, a silicon nitride oxide film, and the like. The organic insulating layer is preferably a single layer or a multilayer formed using polyimide, acrylic, or the like. There is no particular limitation on a method for forming each of the interlayer insulating layers 810, 820, 830, 840, and 850; for example, a sputtering method, an MBE method, a PE-CVD method, a pulse laser deposition method, an atomic layer deposition (ALD) method, or the like can be employed as appropriate.

The semiconductor layer 851 can be a single layer or a stacked layer formed using an oxide semiconductor. The oxide semiconductor is an oxide containing, for example, indium, gallium, and zinc, such as an In—Ga—Zn-based oxide (also referred to as IGZO). Note that the In—Ga—Zn-based oxide means an oxide containing In, Ga, and Zn, and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The oxide semiconductor can be formed by a sputtering method, an ALD method, an evaporation method, a coating method, or the like.

The gate insulating layer 853 is preferably a single layer or a multilayer including an inorganic insulating layer. The gate insulating layer 853 preferably has an effect of supplying oxygen to the semiconductor layer 851.

Next, top views, which correspond to the circuit configuration in FIG. 6, showing the structure where the wiring layer and the gate electrode are in different layers are shown in FIG. 10A and FIGS. 11A to 11C. FIGS. 12A and 12B are cross-sectional views taken along dashed-dotted lines D-D' and E-E' in FIG. 10A and FIGS. 11A to 11C.

Figure 10A:
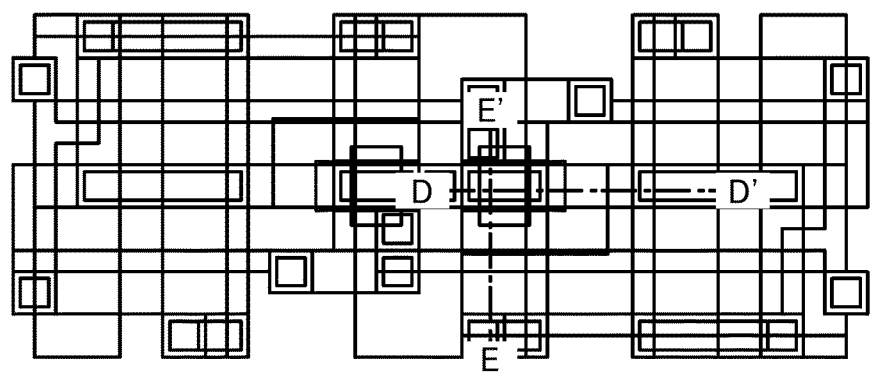
FIGS. 10A and 10B are a top view and a cross-sectional schematic view of a memory cell.

Like the top view in FIG. 7A, the top view in FIG. 10A shows the arrangement of the transistors 121 and 122, the inverter circuits 123 and 124, the transistors Tr1 and Tr2, and the capacitors Cap1 and Cap2 in the circuit diagram in FIG. 6.

Figure 10B:
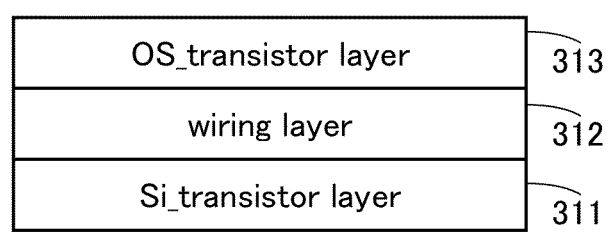

FIG. 10B is a schematic view showing the layer structures of the elements in FIG. 10A for easy understanding of the arrangement of the transistors in FIG. 10A. A first layer 311 in FIG. 10B is a layer in which a transistor including silicon in a semiconductor layer is provided ("Si_transistor layer" in the drawing). A second layer 312 in FIG. 10B is a layer in which a wiring layer for supplying power is provided ("wiring layer" in the drawing). A third layer 313 in FIG. 10B is a layer in which a transistor including an oxide semiconductor in a semiconductor layer is provided ("OS_transistor layer" in the drawing).

The first layer 311, the second layer 312, and the third layer 313 in FIG. 10B are similar to the first layer 301, the second layer 302, and the third layer 303 in FIG. 7B and therefore not repeatedly described here.

Figure 11A:
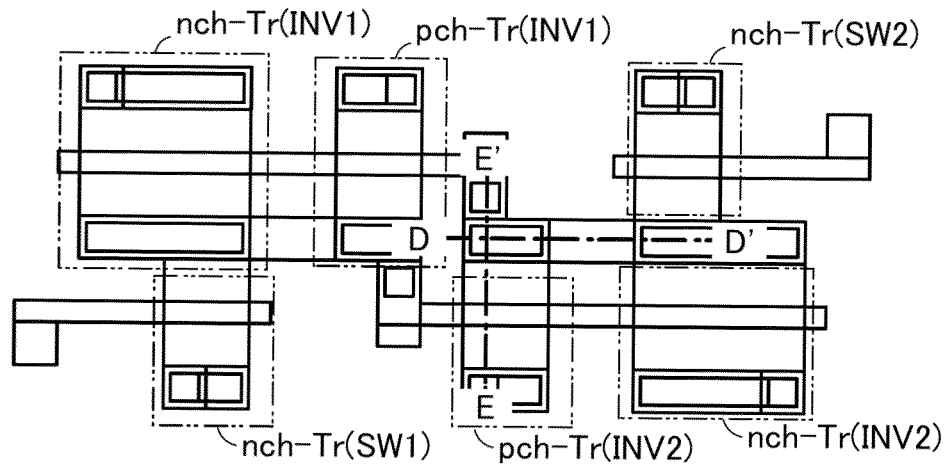
FIGS. 11A to 11C are top views of a memory cell.
Figure 11B:
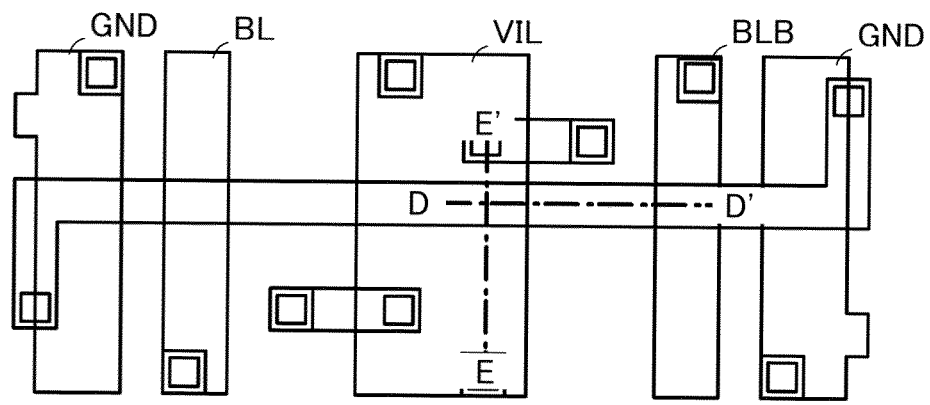
Figure 12A:
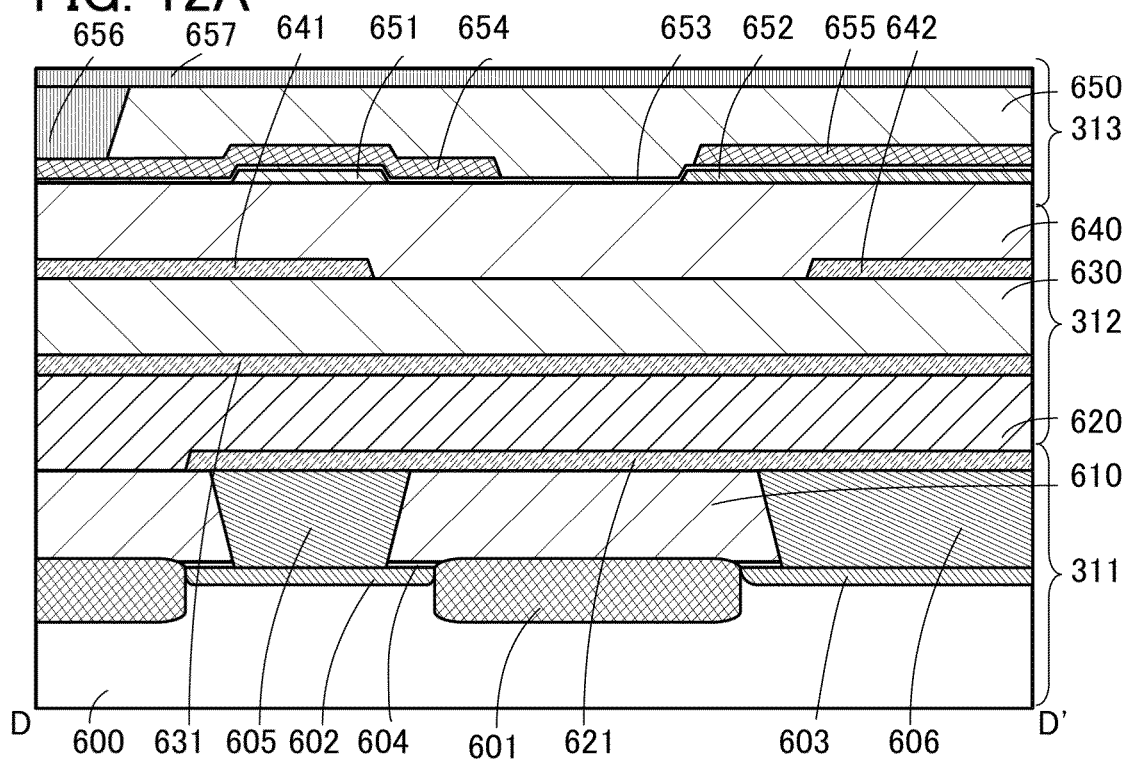
FIGS. 12A and 12B are cross-sectional views of a memory cell.
Figure 12B:
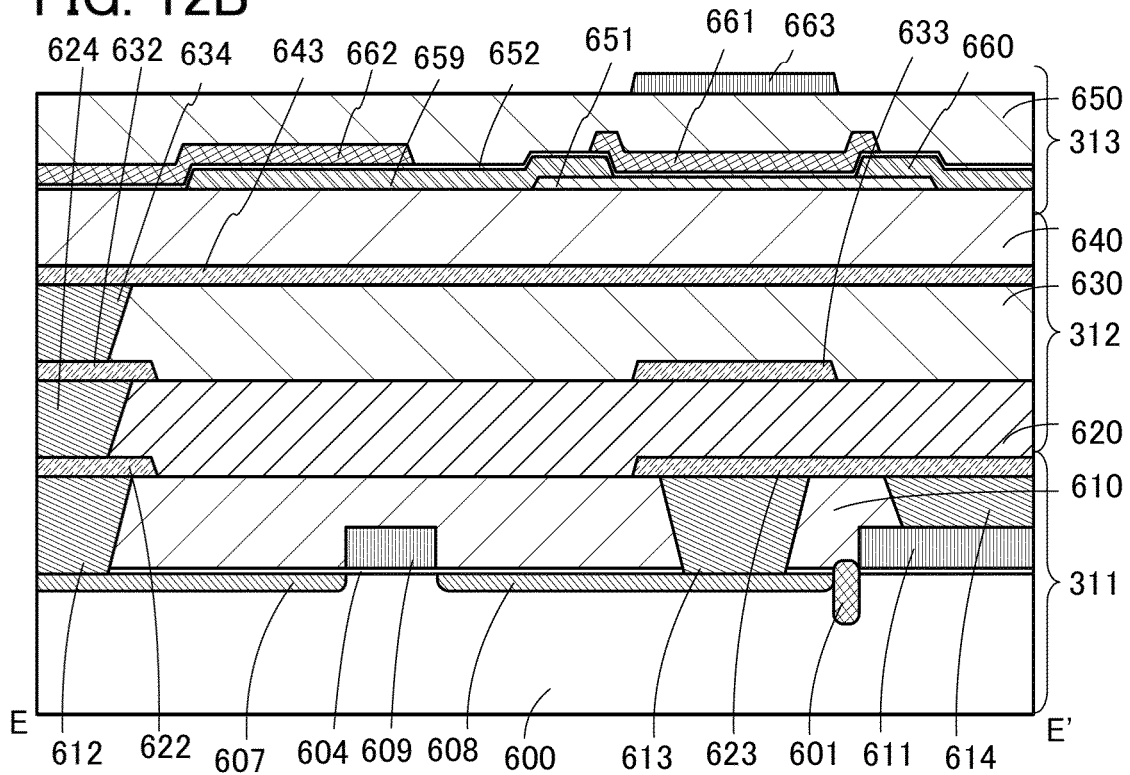

Similarly, the descriptions of the top views in FIGS. 11A and 11B are given in a manner similar to that for the top views in FIGS. 8A and 8B. The descriptions of the first layer 311 and the second layer 312 in FIGS. 11A and 11B are similar to the descriptions of the first layer 301 and the second layer 302 in FIGS. 8A and 8B.

Figure 11C:
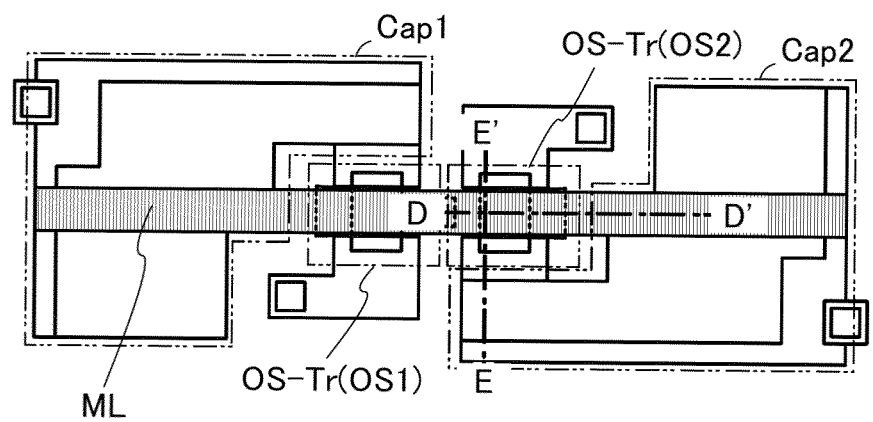

FIG. 11C is a top view of the third layer 313 in FIG. 10B. The top view in FIG. 11C shows the arrangement of a semiconductor layer, a wiring layer provided in the same layer as a gate electrode, a wiring layer provided in the same layer as a source electrode and a drain electrode, a wiring layer for connecting the gate electrodes in memory cells, and openings for connecting the layers, which are included in the transistors each including an oxide semiconductor in a semiconductor layer.

The top view in FIG. 11C shows the arrangement of an n-channel transistor serving as the transistor Tr1 (OS-Tr (OS1)), an n-channel transistor serving as the transistor Tr2 (OS-Tr(OS2)), the capacitors Cap1 and Cap2, a wiring layer for connecting the gate electrodes in the memory cells (the hatched region ML in FIG. 11C), and openings for connecting the layers.

Note that the layouts of the top views in FIGS. 11A to 11C differ from the layouts of the top views in FIGS. 8A to 8C in the layout associated with the region ML in the third layer. Specifically, the difference is that the wiring layer connecting the gate electrodes of the transistors Tr in a plurality of memories (the region ML in FIG. 11C) is provided in the uppermost layer in FIG. 11C, whereby the area of a region where the capacitor Cap1 and the capacitor Cap2 can be provided is increased.

FIG. 12A is a cross-sectional view taken along dashed-dotted line D-D' in FIG. 10A and FIGS. 11A to 11C, and FIG. 12B is a cross-sectional view taken along dashed-dotted line E-E' in FIG. 10A and FIGS. 11A to 11C.

In this embodiment, the transistor in the first layer 311 is formed in a single crystal silicon substrate, the wiring layer in the second layer 312 is formed over the first layer 311, and the transistor in the third layer 313 is formed over the second layer 312. The transistor in the first layer 311 may include a thin semiconductor layer of silicon, germanium, or the like in an amorphous, microcrystalline, polycrystalline, or single crystal state.

FIG. 12A shows a semiconductor substrate 600, an element isolation insulating film 601, an impurity region 602, an impurity region 603, a gate insulating layer 604, a wiring layer 605, a wiring layer 606, an interlayer insulating layer 610, an interlayer insulating layer 620, a wiring layer 621, an interlayer insulating layer 630, a wiring layer 631, an interlayer insulating layer 640, a wiring layer 641, a wiring layer 642, an interlayer insulating layer 650, a semiconductor layer 651, a conductive layer 652, a gate insulating layer 653, a conductive layer 654, a conductive layer 655, a conductive layer 656, and a conductive layer 657.

FIG. 12B shows the semiconductor substrate 600, the element isolation insulating film 601, the gate insulating layer 604, an impurity region 607, an impurity region 608, a gate electrode 609, the interlayer insulating layer 610, a wiring layer 611, a wiring layer 612, a wiring layer 613, a wiring layer 614, a wiring layer 622, a wiring layer 623, a wiring layer 624, the interlayer insulating layer 620, the interlayer insulating layer 630, a wiring layer 632, a wiring layer 633, a wiring layer 634, the interlayer insulating layer 640, a wiring layer 643, the interlayer insulating layer 650, the semiconductor layer 651, a conductive layer 659, a conductive layer 660, the gate insulating layer 653, a gate electrode 661, a conductive layer 662, and a wiring layer 663.

The semiconductor substrate 600 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistor in the first layer 311 is electrically isolated from another transistor by the element isolation insulating film 601. The element isolation insulating film 601 can be formed by a local oxidation of silicon (LOCOS) method, a trench isolation method, or the like.

Each of the impurity regions 602, 603, 607, and 608 is formed in such a manner that an impurity element imparting p-type conductivity or an impurity element imparting n-type conductivity is added to the semiconductor substrate 600 by using an ion doping method, an ion implantation method, or the like as appropriate.

The gate insulating layer 604 is formed in such a manner that the surface of the semiconductor substrate 600 is oxidized by heat treatment, so that a silicon oxide film is formed, and then the silicon oxide film is selectively etched. Alternatively, the gate insulating layer 604 is formed in such a manner that silicon oxide, silicon oxynitride, a metal oxide such as hafnium oxide, which is a high dielectric constant material (also referred to as a high-k material), or the like is formed by a CVD method, a sputtering method, or the like and then is selectively etched.

Each of the gate electrodes 609 and 661, the wiring layers 605, 606, 611, 612, 613, 614, 621, 622, 623, 624, 631, 632, 633, 634, 641, 642, 643, and 663, and the conductive layers 652, 654, 655, 656, 657, 660, and 662 is preferably formed using a metal material such as aluminum, copper, titanium, tantalum, or tungsten. Alternatively, polycrystalline silicon to which an impurity such as phosphorus is added can be used. As the formation method, a variety of film formation methods such as an evaporation method, a PE-CVD method, a sputtering method, and a spin coating method can be used.

Each of the interlayer insulating layers 610, 620, 630, 640, and 650 is preferably a single layer or a multilayer including an inorganic insulating layer or an organic insulating layer. The inorganic insulating layer preferably has a single-layer structure or a layered structure including any of a silicon nitride film, a silicon oxynitride film, a silicon nitride oxide film, and the like. The organic insulating layer is preferably a single layer or a multilayer formed using polyimide, acrylic, or the like. There is no particular limitation on a method for forming each of the interlayer insulating layers 610, 620, 630, 640, and 650; for example, a sputtering method, an MBE method, a PE-CVD method, a pulse laser deposition method, an ALD method, or the like can be employed as appropriate.

The semiconductor layer 651 can be a single layer or a stacked layer formed using an oxide semiconductor.

The gate insulating layer 653 is preferably a single layer or a multilayer including an inorganic insulating layer. The gate insulating layer 653 preferably has an effect of supplying oxygen to the semiconductor layer 651.

In the structure in the top views and cross-sectional views in FIGS. 10A and 10B, FIGS. 11A to 11C, and FIGS. 12A and 12B, which is the structure in this embodiment, as described in Embodiment 1, the wiring layer connecting the gate electrodes of the transistors Tr in the plurality of memories and the gate electrode are provided in different layers. Thus, the wiring layer connecting the gate electrodes of the transistors Tr in the plurality of memories can be provided apart from other conductive layers. Consequently, parasitic capacitance formed around the gate of the transistor Tr can be reduced.

In contrast, in the structure in the top views and cross-sectional views in FIGS. 7A and 7B, FIGS. 8A to 8C, and FIGS. 9A and 9B, the wiring layer connecting the gate electrodes of the transistors Tr in the plurality of memories is provided in the same layer as the gate electrode of the transistor. Accordingly, the wiring layer forms parasitic capacitance with another layer with an insulating layer thinner than other insulating layers, such as the gate insulating layer, provided therebetween.

Further, in the structure in the top views and cross-sectional views in FIGS. 10A and 10B, FIGS. 11A to 11C, and FIGS. 12A and 12B, which is the structure in this embodiment, as described in Embodiment 1, the wiring layer connecting the gate electrodes of the transistors Tr in the plurality of memories and the gate electrode are provided in different layers. Thus, the areas of electrodes of the capacitor Cap1 and the capacitor Cap2 that are formed in the same layer as the gate electrode of the transistor Tr can be increased. Accordingly, the capacitance of the capacitor Cap1 and the capacitor Cap2 can be increased.

In contrast, in the structure in the top views and cross-sectional views in FIGS. 7A and 7B, FIGS. 8A to 8C, and FIGS. 9A and 9B, the wiring layer connecting the gate electrodes of the transistors Tr in the plurality of memories is provided in the same layer as the gate electrode of the transistor. Therefore, the wiring layer connecting the gate electrodes of the transistors Tr in the plurality of memories needs to be provided apart from a conductive layer in the same layer, and thus the areas of the capacitor Cap1 and the capacitor Cap2 provided in the same layer as the wiring layer are reduced. Accordingly, the capacitance of the capacitor Cap1 and the capacitor Cap2 cannot be increased.

Further, in the structure in the top views and cross-sectional views in FIGS. 10A and 10B, FIGS. 11A to 11C, and FIGS. 12A and 12B, which is the structure in this embodiment, a layer in which the wiring layer for supplying power is provided is provided between a layer in which the transistor including silicon in a semiconductor layer is provided and a layer in which the transistor including an oxide semiconductor in a semiconductor layer is provided. Thus, as compared with the case where the wiring layer for supplying power is provided above the layer in which the transistor including an oxide semiconductor in a semiconductor layer is provided, the number of openings provided in the layers forming the capacitor Cap1 and the capacitor Cap2 can be minimized.

The structure in this embodiment described above not only reduces parasitic capacitance formed around the gate of the transistor Tr, but also increases the area occupied by the capacitor because the gate electrodes of the transistors Tr in a plurality of memories are not connected to one another in the same layer as the gate electrode. Therefore, even with miniaturized transistors and capacitors, a reduction in parasitic capacitance and an increase in the area for the capacitor can be achieved, so that fluctuations of the potentials of the volatile memory portion VN and the nonvolatile memory portion NVN can be reduced.

This embodiment can be combined with any of the other embodiments as appropriate.

(Embodiment 3)

In this embodiment, a structure different from that in the top views and cross-sectional views in FIGS. 10A and 10B, FIGS. 11A to 11C, and FIGS. 12A and 12B in Embodiment 2 is described with reference to FIGS. 15A and 15B, FIGS. 16A to 16D, FIG. 17, and FIG. 18. Note that the circuit diagram in FIG. 6 corresponds to the top views and cross-sectional views in FIGS. 15A and 15B, FIGS. 16A to 16D, and FIG. 17.

FIG. 15A and FIGS. 16A to 16D are top views, which correspond to the circuit configuration in FIG. 6, showing a structure in which a wiring layer and a gate electrode are provided in different layers and the transistor Tr1 and the transistor Tr2 overlap with the wiring VIL that supplies high power supply potential. FIG. 17 is a cross-sectional view taken along dashed-dotted line F-F' in FIG. 15A and FIGS. 16A to 16D, and FIG. 18 is a cross-sectional view taken along dashed-dotted line G-G' in FIG. 15A and FIGS. 16A to 16D.

Figure 15A:
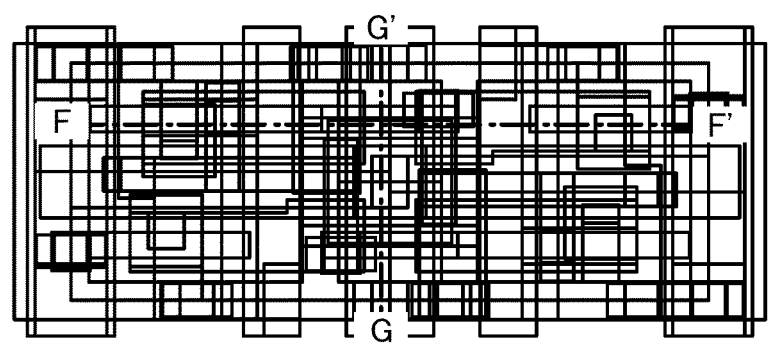
FIGS. 15A and 15B are a top view and a cross-sectional schematic view of a memory cell.

The top view in FIG. 15A shows the arrangement of the transistors 121 and 122, the inverter circuits 123 and 124, the transistors Tr1 and Tr2, and the capacitors Cap1 and Cap2 in the circuit diagram in FIG. 6.

Figure 15B:
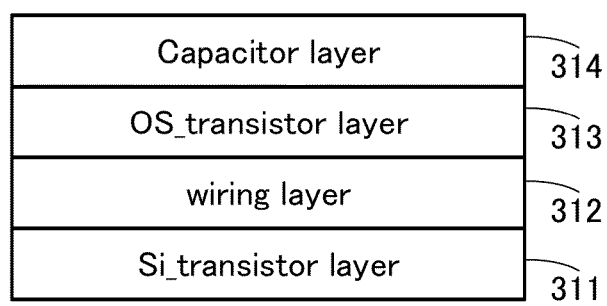

FIG. 15B is a schematic view showing the layer structures of the elements in FIG. 15A for easy understanding of the arrangement of the transistors in FIG. 15A. The first layer 311 in FIG. 15B is a layer in which a transistor including silicon in a semiconductor layer is provided ("Si_transistor layer" in the drawing). The second layer 312 in FIG. 15B is a layer in which a wiring layer for supplying power is provided ("wiring layer" in the drawing). The third layer 313 in FIG. 15B is a layer in which a transistor including an oxide semiconductor in a semiconductor layer is provided ("OS_transistor layer" in the drawing). A fourth layer 314 in FIG. 15B is a layer in which the capacitors and a wiring layer connecting the gate electrodes of the transistors Tr in a plurality of memories are provided ("Capacitor layer" in the drawing).

The first layer 311 in FIG. 15B includes transistors each including silicon in a semiconductor layer, i.e., the transistor 121 (SW1) and the transistor 122 (SW2), the inverter circuit 123 (INV1), and the inverter circuit 124 (INV2). The second layer 312 in FIG. 15B includes a wiring layer serving as the wirings GND that supply ground potential, the bit line BL, the wiring VIL that supplies high power supply potential, and the inverted bit line BLB. The third layer 313 in FIG. 15B includes transistors each including an oxide semiconductor in a semiconductor layer, i.e., the transistors Tr1 (OS1) and Tr2 (OS2). The fourth layer 314 in FIG. 15B includes the capacitor Cap1, the capacitor Cap2, and the wiring layer connecting the gate electrodes of the transistors Tr in the plurality of memories.

Figure 16A:
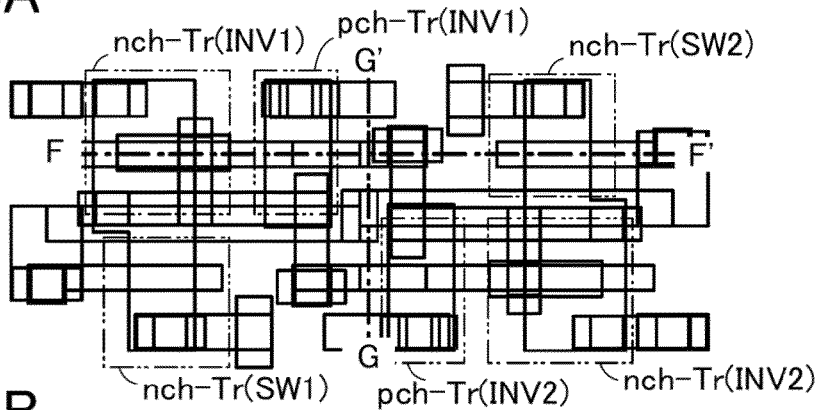
FIGS. 16A to 16D are top views of a memory cell.
Figure 17:
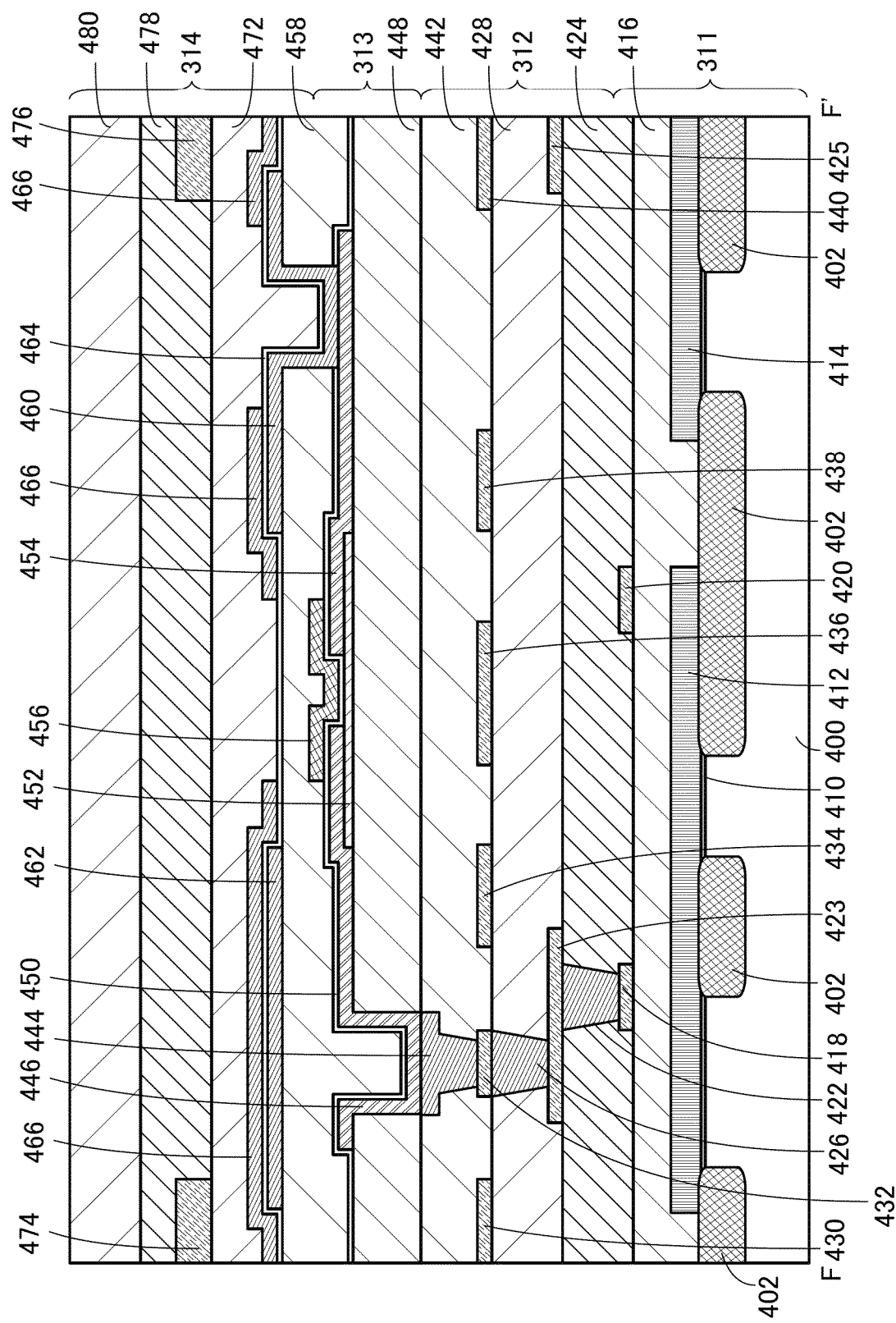
FIG. 17 is a cross-sectional view of a memory cell.

FIG. 16A is a top view of the first layer 311 in FIG. 15B. The top view in FIG. 16A shows the arrangement of a semiconductor layer, a wiring layer provided in the same layer as a gate electrode, a wiring layer provided in the same layer as a source electrode and a drain electrode, and openings for connecting the layers, which are included in the transistors each including silicon in a semiconductor layer.

The top view in FIG. 16A shows the arrangement of an n-channel transistor serving as the transistor 121 (nch-Tr (SW1)), an n-channel transistor serving as the transistor 122 (nch-Tr(SW2)), a p-channel transistor (pch-Tr(INV1)) and an n-channel transistor (nch-Tr(INV1)) included in the inverter circuit 123, and a p-channel transistor (pch-Tr(INV2)) and an n-channel transistor (nch-Tr(INV2)) included in the inverter circuit 124.

Figure 16B:
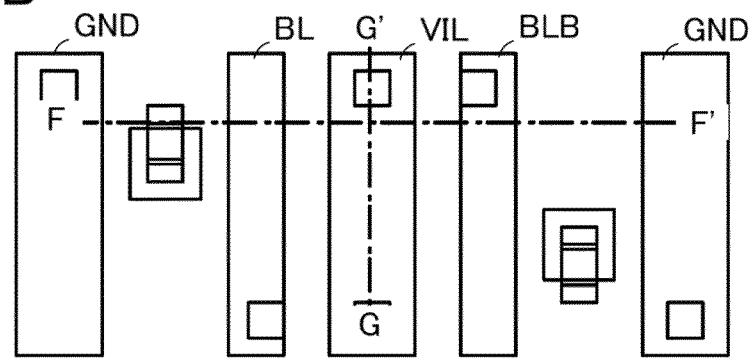

FIG. 16B is a top view of the second layer 312 in FIG. 15B. The top view in FIG. 16B shows the arrangement of wiring layers provided in a plurality of layers and openings for connecting the layers.

The top view in FIG. 16B shows the arrangement of the wirings GND that supply ground potential, the bit line BL, the wiring VIL that supplies high power supply potential, and the inverted bit line BLB.

Figure 16C:
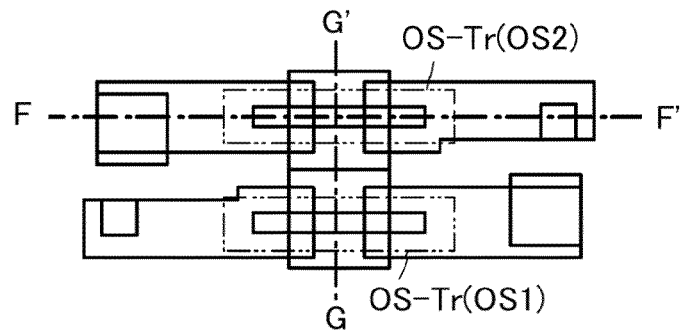

FIG. 16C is a top view of the third layer 313 in FIG. 15B. The top view in FIG. 16C shows the arrangement of a semiconductor layer, a gate electrode, a wiring layer provided in the same layer as a source electrode and a drain electrode, and openings for connecting the layers, which are included in the transistors each including an oxide semiconductor in a semiconductor layer.

The top view in FIG. 16C shows the arrangement of an n-channel transistor serving as the transistor Tr1 (OS-Tr (OS1)), an n-channel transistor serving as the transistor Tr2 (OS-Tr(OS2)), and openings for connecting the layers.

Figure 16D:
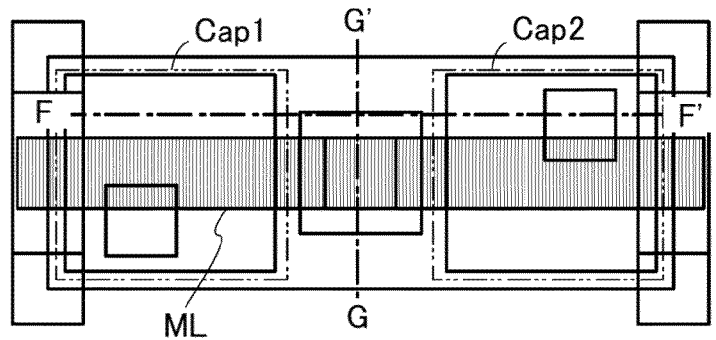

FIG. 16D is a top view of the fourth layer 314 in FIG. 15B. The top view in FIG. 16D shows the arrangement of conductive layers included in the capacitor, a wiring layer for connecting the gate electrodes in the memory cells, and openings for connecting the layers.

The top view in FIG. 16D shows the arrangement of the capacitors Cap1 and Cap2 and a wiring layer for connecting the gate electrodes in the memory cells (the hatched region ML in FIG. 16D).

Note that the layouts of the top views in FIGS. 16A to 16D differ from the layouts of the top views in FIGS. 11A to 11C in that the transistor Tr1 and the transistor Tr2 overlap with the wiring VIL that supplies high power supply potential and in that the capacitor Cap1 and the capacitor Cap2 are provided in the fourth layer 314 in which the wiring layer connecting the gate electrodes of the transistors Tr in the plurality of memories is provided.

In the circuit configuration in FIG. 6, the speed of data backup and data recovery is largely dependent on the on-state current of each transistor (OS-Tr(OS1) and OS-Tr(OS2)); thus, the on-state current is preferably as high as possible. However, miniaturization of elements requires lower driving voltage and makes it difficult to secure high on-state current of the transistor. Note that an increase in on-state current without a change in transistor size can be achieved by addition of an electrode serving as a back gate and voltage application to the back gate; however, such a structure complicates the manufacturing process, wirings of a circuit, and the operation of the semiconductor device.

When the transistor Tr1 and the transistor Tr2 are provided to overlap with the wiring VIL that supplies high power supply potential, as in the structure described in this embodiment, the on-state current can be increased.

Note that in the structure in this embodiment, the potential of the wiring VIL, which is controlled for switching between power supply and power supply stop, is set to high power supply potential (VDD) when power is supplied to the semiconductor device, and is set to ground potential (equal to the potential of the wiring GND) when power is not supplied. In such a case, for example, a circuit configuration in FIG. 19A can be employed.

Figure 19A:
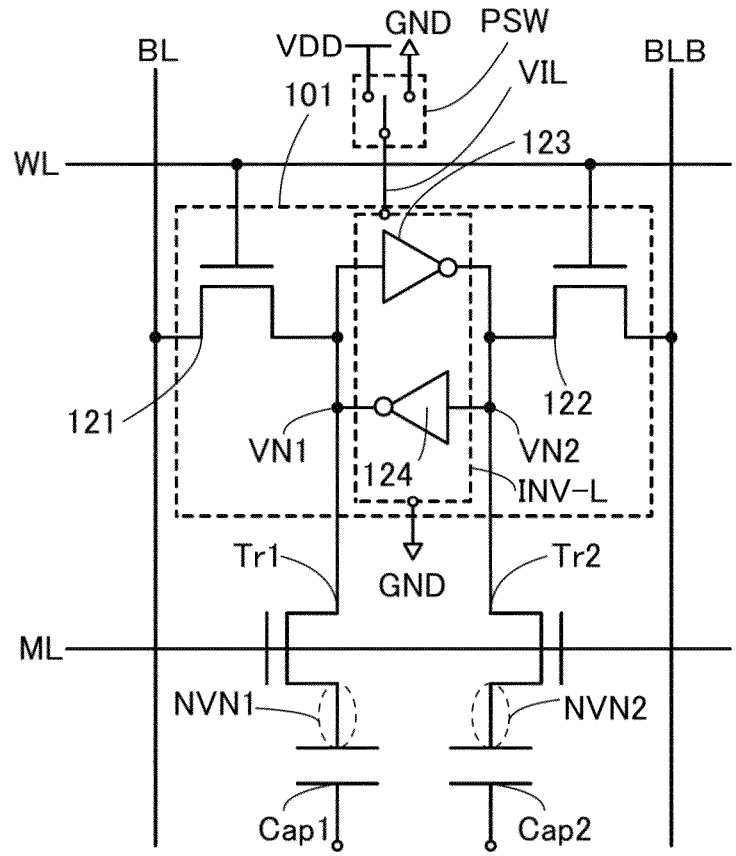
FIG. 19A is a circuit diagram of a memory cell.

In the circuit configuration in FIG. 19A, a switch PSW is connected to a wiring that supplies high power supply potential, and the potential of the wiring VIL is switched between VDD and GND by control of the switch PSW. With this configuration, power is supplied to the memory cell when the switch PSW connects the wiring VIL to VDD, and power supply to the memory cell is stopped when the switch PSW connects the wiring VIL to GND.

Figure 19B:
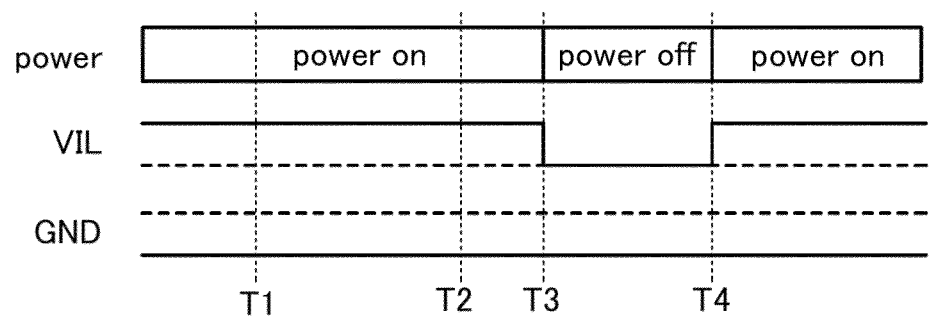
FIG. 19B is a timing chart of the memory cell.

The operation of switching the potential of the wiring VIL is shown in FIG. 19B in combination with the timing chart in FIG. 2B. FIG. 19B shows "power" indicating whether power is supplied or not and change in the potentials of the wiring VIL and the wiring GND. As shown in FIG. 19B, the potential of the wiring VIL that supplies power supply potential is set to high power supply potential when power is supplied to the semiconductor device, and the wiring VIL functions as back gates of the transistor Tr1 and the transistor Tr2; thus, the on-state current of the transistor Tr1 and the transistor Tr2 can be increased. Meanwhile, as shown in FIG. 19B, the potential of the wiring VIL that supplies power supply potential is set to ground potential when power is not supplied to the semiconductor device, and the wiring VIL functions as back gates of the transistor Tr1 and the transistor Tr2; thus, the feature of low off-state current of the transistor Tr1 and the transistor Tr2 is not adversely affected. Consequently, high on-state current of the transistor Tr1 and the transistor Tr2 can be secured without complicating the manufacturing process, wirings of a circuit, and the operation of the semiconductor device even in the case where the transistors are miniaturized.

FIG. 17 is a cross-sectional view taken along dashed-dotted line F-F' in FIG. 15A and FIGS. 16A to 16C, and FIG. 18 is a cross-sectional view taken along dashed-dotted line G-G' in FIG. 15A and FIGS. 16A to 16C.

In this embodiment, the transistor in the first layer 311 is formed in a single crystal silicon substrate, the wiring layer in the second layer 312 is formed over the first layer 311, the transistor in the third layer 313 is formed over the second layer 312, and the capacitor and the wiring layer connecting the gate electrodes of the transistors Tr in the plurality of memories in the fourth layer 314 are formed over the third layer 313. The transistor in the first layer 311 may include a thin semiconductor layer of silicon, germanium, or the like in an amorphous, microcrystalline, polycrystalline, or single crystal state.

FIG. 17 shows a semiconductor substrate 400, an element isolation insulating film 402, a gate insulating layer 410, a gate electrode 412, a gate electrode 414, an interlayer insulating layer 416, a wiring layer 418, a wiring layer 420, a conductive layer 422, an interlayer insulating layer 424, a wiring layer 423, a conductive layer 426, an interlayer insulating layer 428, a wiring layer 430, a wiring layer 432, a wiring layer 434, a wiring layer 436, a wiring layer 438, a wiring layer 440, a conductive layer 444, an interlayer insulating layer 442, a wiring layer 446, an interlayer insulating layer 448, a semiconductor layer 452, a gate insulating layer 450, a wiring layer 454, a gate electrode 456, an interlayer insulating layer 458, a conductive layer 460, a conductive layer 462, an insulating layer 464, a conductive layer 466, a conductive layer 468, an interlayer insulating layer 472, a wiring layer 474, a wiring layer 476, an interlayer insulating layer 478, and an interlayer insulating layer 480.

Figure 18:
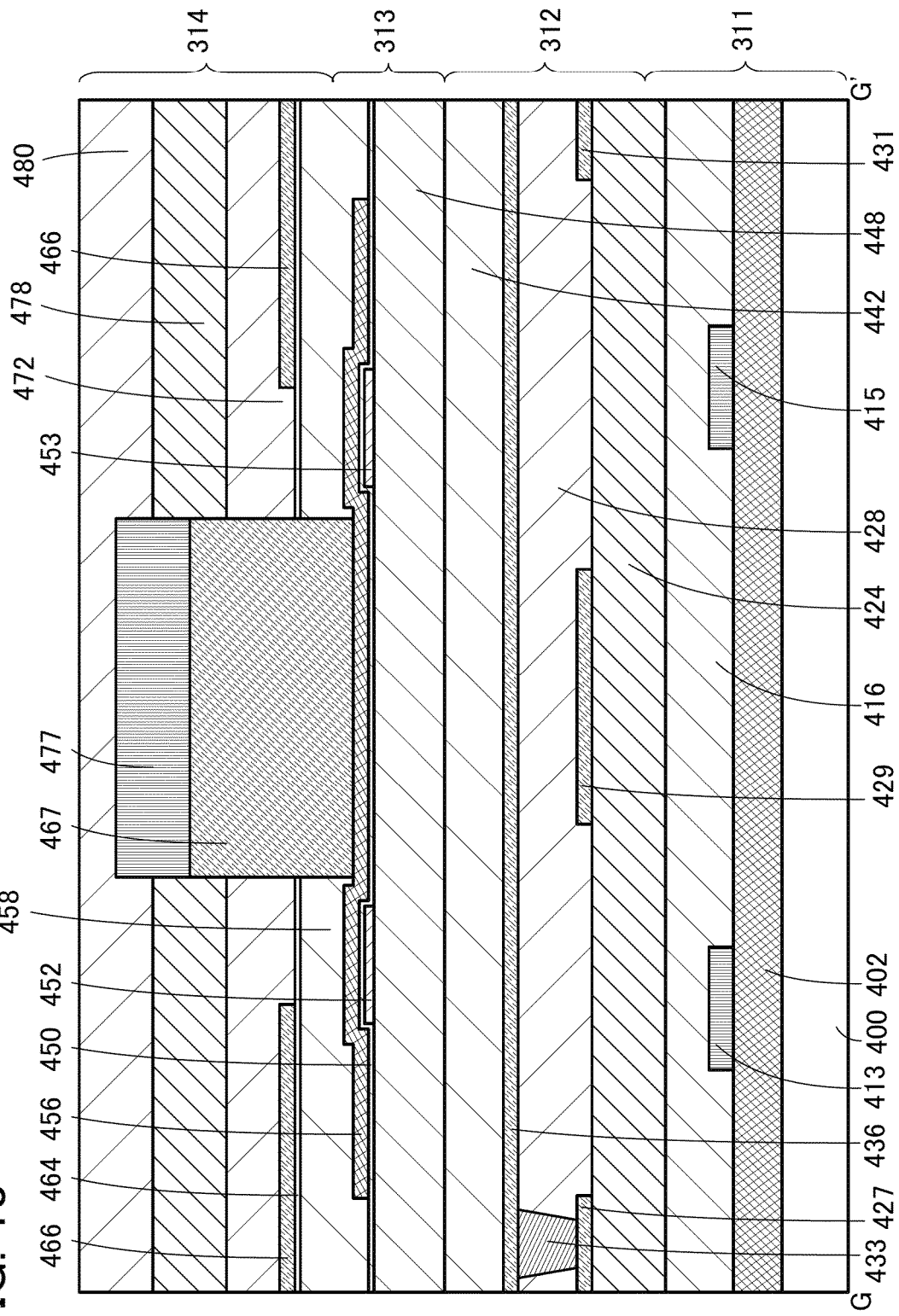
FIG. 18 is a cross-sectional view of a memory cell.

FIG. 18 shows the semiconductor substrate 400, the element isolation insulating film 402, a gate electrode 413, a gate electrode 415, the interlayer insulating layer 416, the interlayer insulating layer 424, a wiring layer 427, a wiring layer 429, a wiring layer 431, a conductive layer 433, the interlayer insulating layer 428, the wiring layer 436, the interlayer insulating layer 442, the interlayer insulating layer 448, the semiconductor layer 452, a semiconductor layer 453, the gate insulating layer 450, the gate electrode 456, the interlayer insulating layer 458, the insulating layer 464, the conductive layer 466, the interlayer insulating layer 472, the interlayer insulating layer 478, a conductive layer 467, a wiring layer 477, and the interlayer insulating layer 480.

The semiconductor substrate 400 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistor in the first layer 311 is electrically isolated from another transistor by the element isolation insulating film 402. The element isolation insulating film 402 can be formed by a local oxidation of silicon (LOCOS) method, a trench isolation method, or the like.

The gate insulating layer 410 is formed in such a manner that the surface of the semiconductor substrate 400 is oxidized by heat treatment, so that a silicon oxide film is formed, and then the silicon oxide film is selectively etched. Alternatively, the gate insulating layer 410 is formed in such a manner that silicon oxide, silicon oxynitride, a metal oxide such as hafnium oxide, which is a high dielectric constant material (also referred to as a high-k material), or the like is formed by a CVD method, a sputtering method, or the like and then is selectively etched.

Each of the gate electrodes 412, 413, 414, 415, and 456, the wiring layers 418, 420, 423, 427, 429, 430, 431, 432, 434, 436, 438, 440, 446, 454, 474, 476, and 477, and the conductive layers 422, 426, 433, 444, 460, 462, 466, 467, and 468 is preferably formed using a metal material such as aluminum, copper, titanium, tantalum, or tungsten. Alternatively, polycrystalline silicon to which an impurity such as phosphorus is added can be used. As the formation method, a variety of film formation methods such as an evaporation method, a PE-CVD method, a sputtering method, and a spin coating method can be used.

Each of the interlayer insulating layers 416, 424, 428, 442, 448, 458, 472, 478, and 480 and the insulating layer 464 is preferably a single layer or a multilayer including an inorganic insulating layer or an organic insulating layer. The inorganic insulating layer preferably has a single-layer structure or a layered structure including any of a silicon nitride film, a silicon oxynitride film, a silicon nitride oxide film, and the like. The organic insulating layer is preferably a single layer or a multilayer formed using polyimide, acrylic, or the like. There is no particular limitation on a method for forming each of the insulating layers; for example, a sputtering method, an MBE method, a PE-CVD method, a pulse laser deposition method, an ALD method, or the like can be employed as appropriate.

Each of the semiconductor layers 452 and 453 can be a single layer or a stacked layer formed using an oxide semiconductor. The oxide semiconductor is an oxide containing, for example, indium, gallium, and zinc, such as an In—Ga—Zn-based oxide (also referred to as IGZO). Note that the In—Ga—Zn-based oxide means an oxide containing In, Ga, and Zn, and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The oxide semiconductor can be formed by a sputtering method, an ALD method, an evaporation method, a coating method, or the like.

The gate insulating layer 450 is preferably a single layer or a multilayer including an inorganic insulating layer. The gate insulating layer 450 preferably has an effect of supplying oxygen to the semiconductor layers 452 and 453.

In the structure in this embodiment described above, the on-state current of the transistor Tr1 and the transistor Tr2 can be increased when power is supplied to the semiconductor device. Meanwhile, when power is not supplied to the semiconductor device, the potential of the wiring VIL is set to ground potential; thus, the feature of low off-state current of the transistor Tr1 and the transistor Tr2 is not adversely affected. Consequently, high on-state current of the transistor Tr1 and the transistor Tr2 can be secured without complicating the manufacturing process, wirings of a circuit, and the operation of the semiconductor device even in the case where the transistors are miniaturized.

This embodiment can be combined with any of the other embodiments as appropriate.

(Embodiment 4)

In this embodiment, an oxide semiconductor that can be used for the semiconductor layer of the transistor with a low off-state current described in the above embodiments will be described.

An oxide semiconductor used for a channel formation region in the semiconductor layer of the transistor preferably contains at least indium (In) or zinc (Zn). In particular, the oxide semiconductor preferably contains both In and Zn. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

When an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off state can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

An oxide semiconductor which is formed may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a c-axis aligned crystalline oxide semiconductor (CAAC-OS).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31° which shows alignment appears in some cases. Further, for example, spots (luminescent spots) are observed in an electron diffraction pattern of the CAAC-OS in some cases. An electron diffraction pattern obtained with an electron beam having a diameter of 10 nmϕ or smaller, or 5 nmϕ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states, for example. In an oxide semiconductor, for example, oxygen vacancies are defect states. The oxygen vacancies serve as trap states or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor which includes the oxide semiconductor having a high density of trap states in the channel formation region has unstable electrical characteristics in some cases.

A transistor including the highly purified intrinsic or substantially highly purified intrinsic CAAC-OS has a small variation in the electrical characteristics due to irradiation with visible light or ultraviolet light.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly observed in some cases. In an image of the nc-OS obtained with a TEM, for example, since a clear grain boundary does not exist, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than that of a crystal part, a peak which shows alignment does not appear in some cases. Further, for example, a halo pattern is observed in some cases in an electron diffraction pattern of the nc-OS obtained by using an electron beam having a diameter larger than that of a crystal part (e.g., a beam diameter of 20 nm$\phi$ or more, or 50 nm$\phi$ or more). For example, spots are observed in some cases in a nanobeam electron diffraction pattern of the nc-OS obtained by using an electron beam having a diameter smaller than or equal to that of a crystal part (e.g., a beam diameter of 10 nm$\phi$ or less, or 5 nm$\phi$ or less). In a nanobeam electron diffraction pattern of the nc-OS, for example, regions with high luminance in a circular pattern are observed in some cases. In a nanobeam electron diffraction pattern of the nc-OS, for example, a plurality of spots are observed in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

This embodiment can be combined with any of the other embodiments as appropriate.

(Embodiment 5)

In this embodiment, application examples of the semiconductor device described in the above embodiment to an electronic component and to an electronic device including the electronic component will be described with reference to FIGS. 13A and 13B and FIGS. 14A to 14E.

Figure 13A:
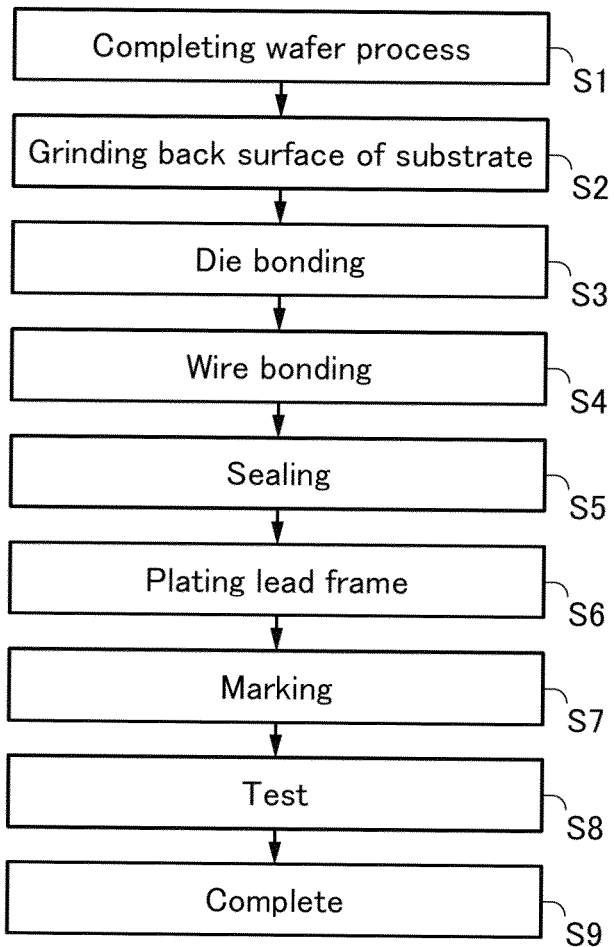
FIG. 13A is a flow chart showing steps of manufacturing a semiconductor device.

FIG. 13A shows an example where the semiconductor device described in the above embodiment is used to make an electronic component. Note that an electronic component is also referred to as semiconductor package or IC package. This electronic component has a plurality of standards and names depending on a terminal extraction direction and a terminal shape. Thus, examples of the electronic component are described in this embodiment.

A semiconductor device including the transistors illustrated in FIGS. 10A and 10B, FIGS. 11A to 11C, and FIGS. 12A and 12B in Embodiment 2 or FIGS. 15A and 15B, FIGS. 16A to 16D, FIG. 17, FIG. 18, and FIGS. 19A and 19B in Embodiment 3 undergoes the assembly process (post-process) to be completed in combination with components detachable to a printed wiring board.

The post-process can be completed through steps shown in FIG. 13A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step is performed to grind the back surface of the substrate to separate the substrate into a plurality of chips. Then, a die bonding step is performed so that separate chips are individually picked up to be mounted on and bonded to a lead frame (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the circuit portion and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed wiring board in a later step can be performed with higher reliability.

Next, printing process (marking) is performed on a surface of the package (Step S7). Then, through a final test step (Step S8), the electronic component is completed (Step S9).

The aforementioned electronic component can include the semiconductor device described in the above embodiment. Thus, the semiconductor device in the electronic component can achieve the following: storage capacity needed for holding data can be secured even with miniaturized elements; and storage capacity needed for normal operation can be reduced by a reduction in parasitic capacitance of a transistor. The electronic component includes a semiconductor device including a memory cell in which parasitic capacitance of a transistor that is used for data backup and data recovery is reduced so that storage capacity needed for holding data can be secured easily. Therefore, the electronic component can perform data backup and data recovery with higher reliability.

Figure 13B:
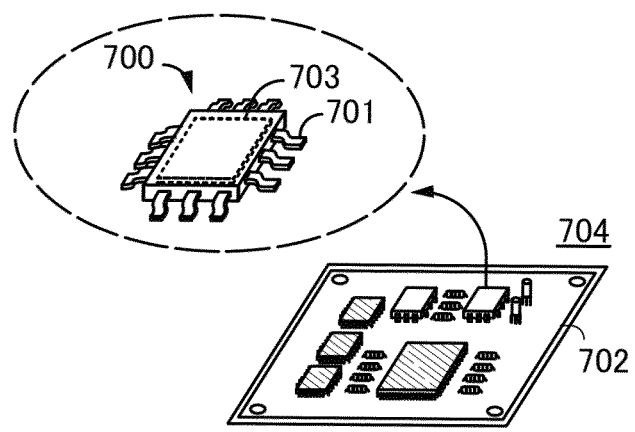
FIG. 13B is a perspective schematic view of the semiconductor device.

FIG. 13B is a perspective schematic view of the completed electronic component. FIG. 13B illustrates a perspective schematic view of a quad flat package (QFP) as an example of the electronic component. An electronic component 700 illustrated in FIG. 13B includes a lead 701 and a semiconductor device 703. The electronic component 700 in FIG. 13B is mounted on a printed wiring board 702, for example. The plurality of electronic components 700 are used in combination and electrically connected to each other over the printed wiring board 702; thus, a circuit board on which the electronic components are mounted (a circuit board 704) is completed. The completed circuit board 704 is provided in an electronic device or the like.

Next, description is made on applications of the above electronic component to electronic devices such as a computer, a portable information terminal (including a mobile phone, a portable game machine, an audio reproducing device, and the like), electronic paper, a television device (also referred to as television or television receiver), and a digital video camera.

Figure 14A:
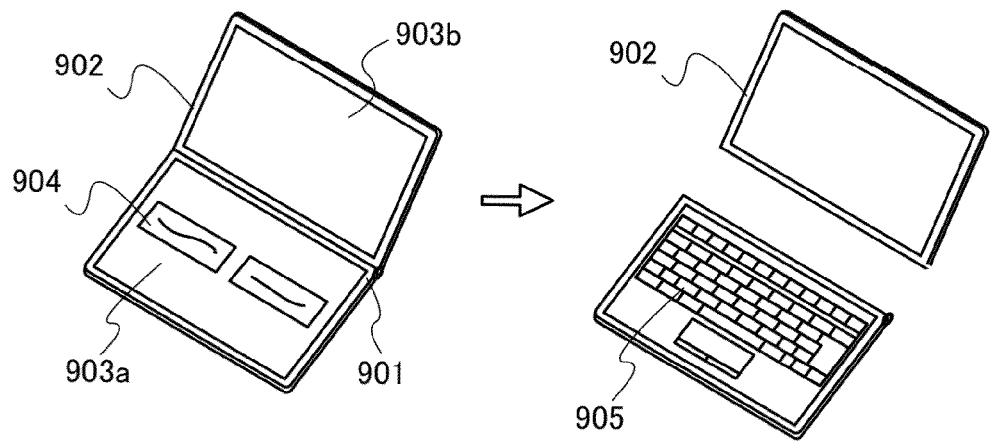
FIGS. 14A to 14E each illustrate an electronic device including a semiconductor device.

FIG. 14A illustrates a portable information terminal, which includes a housing 901, a housing 902, a first display portion 903a, a second display portion 903b, and the like. At least one of the housings 901 and 902 includes a circuit board including the semiconductor device described in the above embodiment. Thus, a portable information terminal that can perform data backup and data recovery with higher reliability can be provided.

Note that the first display portion 903a is a touch panel, and for example, as illustrated in the left of FIG. 14A, which of "touch input" and "keyboard input" is performed can be selected by a selection button 904 displayed on the first display portion 903a. Since the selection buttons with a variety of sizes can be displayed, the portable information terminal can be easily used by people of any generation. For example, when "touch input" is selected, a keyboard 905 is displayed on the first display portion 903a as illustrated in the right of FIG. 14A. With the keyboard 905, letters can be input quickly by keyboard input as in the case of using a conventional information terminal, for example.

Further, one of the first display portion 903a and the second display portion 903b can be detached from the portable information terminal as illustrated in the right of FIG. 14A. The first display portion 903a can also function as a touch panel for a reduction in weight to carry around to be operated by one hand while the other hand supports the housing 902, which is convenient.

The portable information terminal illustrated in FIG. 14A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the back surface or the side surface of the housing.

The portable information terminal illustrated in FIG. 14A may transmit and receive data wirelessly. Through wireless communication, desired book data or the like can be purchased and downloaded from an e-book server.

Further, the housing 902 in FIG. 14A may have an antenna, a microphone function, or a wireless communication function to be used as a mobile phone.

Figure 14B:
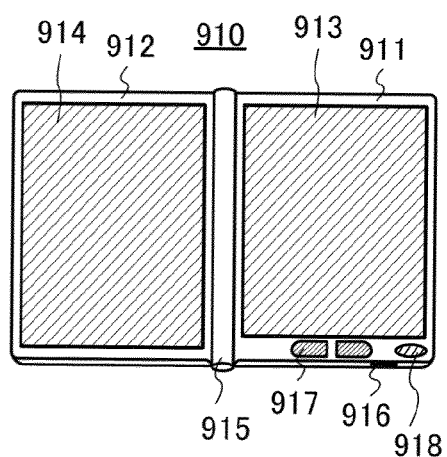

FIG. 14B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. At least one of the housings 911 and 912 includes a circuit board including the semiconductor device described in the above embodiment. Thus, an e-book reader that can perform data backup and data recovery with higher reliability can be provided.

Figure 14C:
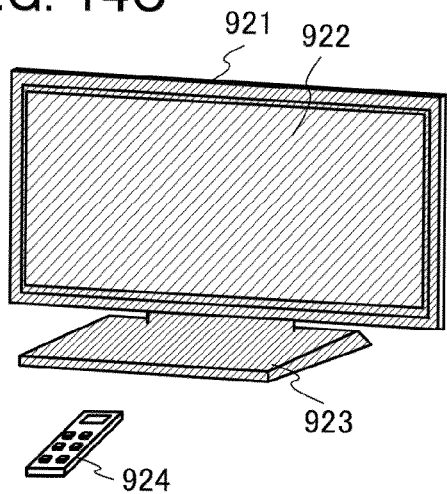

FIG. 14C illustrates a television device, which includes a housing 921, a display portion 922, a stand 923, and the like. The television device 920 can be operated with a switch of the housing 921 and a separate remote controller 924. The housing 921 and the remote controller 924 include a circuit board including the semiconductor device described in the above embodiment. Thus, a television device that can perform data backup and data recovery with higher reliability can be provided.

Figure 14D:
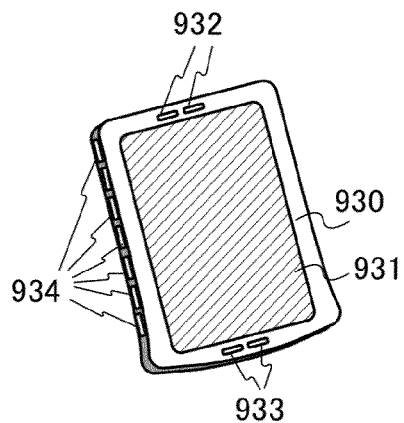

FIG. 14D illustrates a smartphone in which a main body 930 includes a display portion 931, a speaker 932, a microphone 933, operation buttons 934, and the like. The main body 930 includes a circuit board including the semiconductor device described in the above embodiment. Thus, a smartphone that can perform data backup and data recovery with higher reliability can be provided.

Figure 14E:
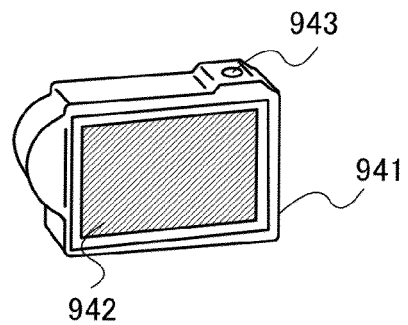

FIG. 14E illustrates a digital camera, which includes a main body 941, a display portion 942, an operation switch 943, and the like. The main body 941 includes a circuit board including the semiconductor device described in the above embodiment. Thus, a digital camera that can perform data backup and data recovery with higher reliability can be provided.

As described above, the electronic devices shown in this embodiment each include a circuit board including the semiconductor device of the above embodiment. Thus, an electronic device that can perform data backup and data recovery with higher reliability can be provided.

EXAMPLE 1

A 32-bit microprocessor incorporating a cache memory with the structure of the semiconductor device (hereinafter referred to as OS-SRAM) described in Embodiment 3 was prototyped. In this example, the evaluation results of the 32-bit microprocessor are described.

Figure 20:
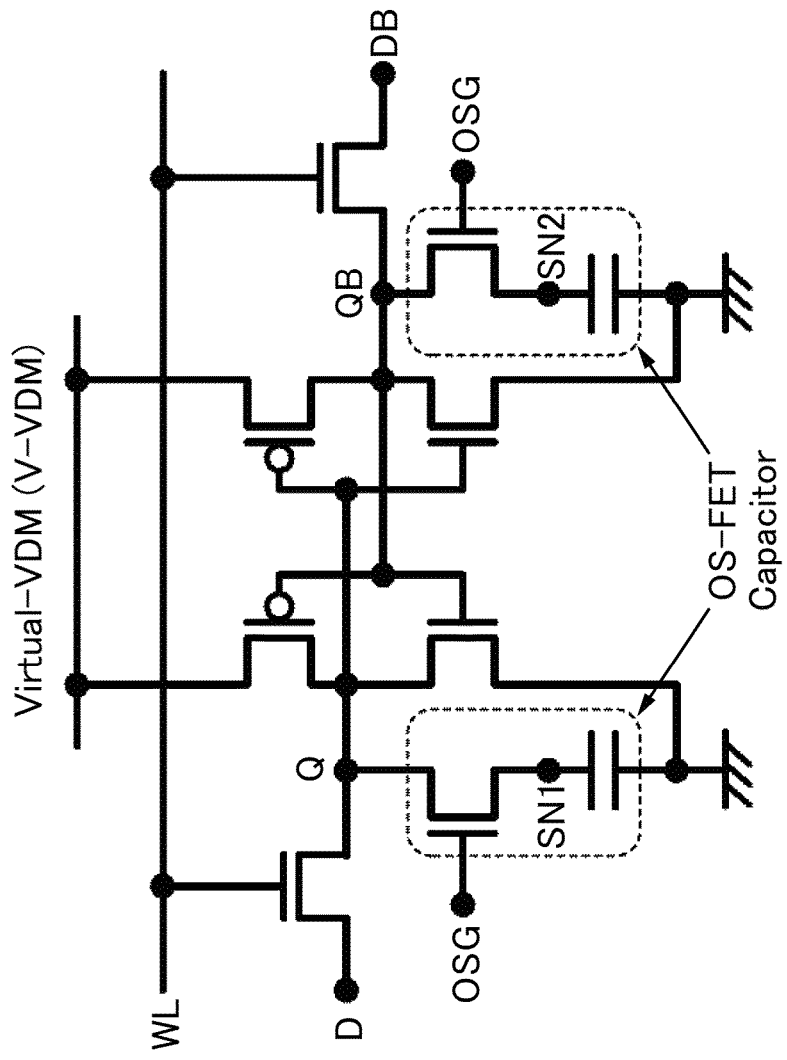
FIG. 20 is a circuit diagram of an OS-SRAM.
Figure 21:
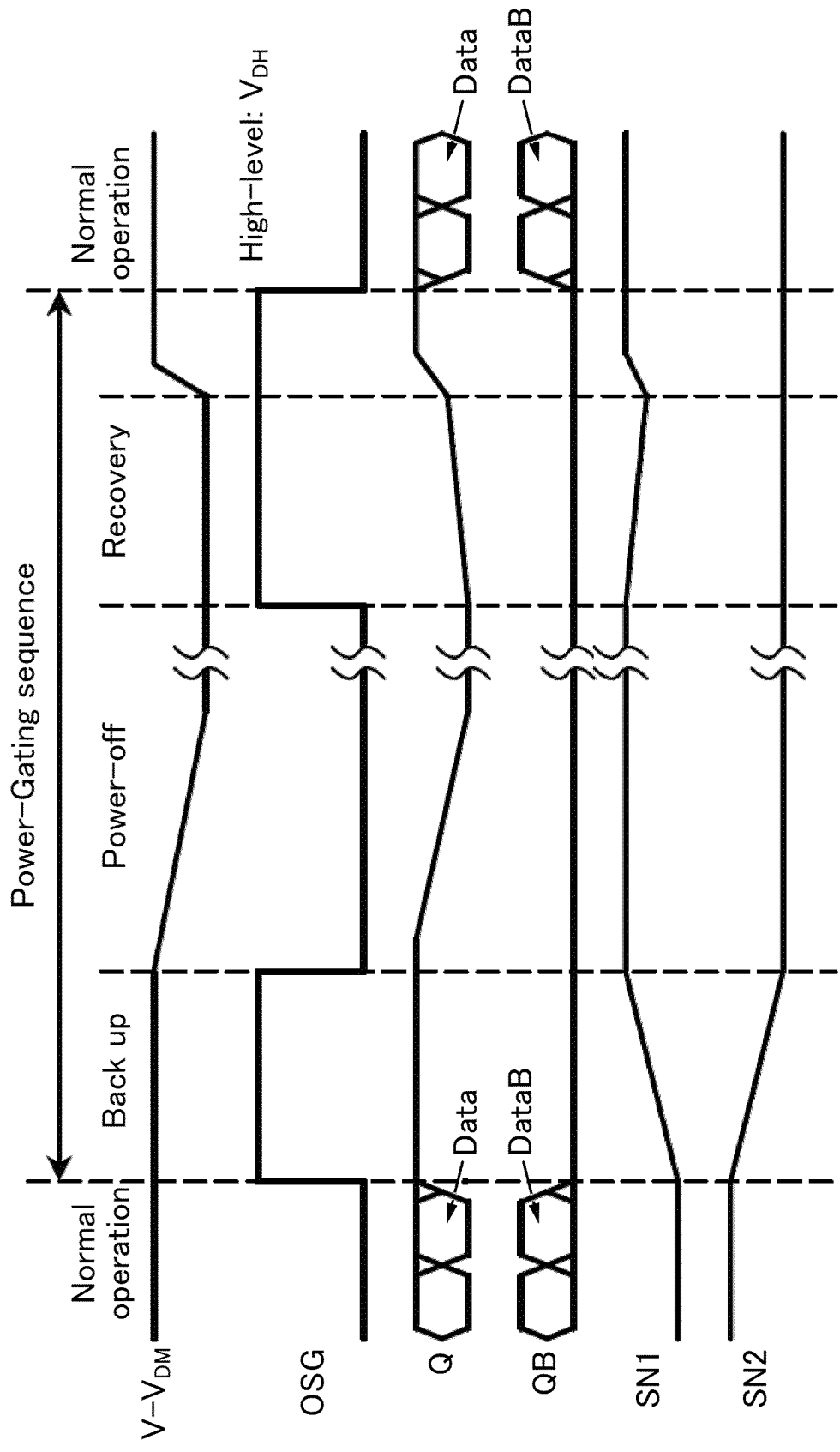
FIG. 21 is power-gating sequence of an OS-SRAM.

FIG. 20 and FIG. 21 show a circuit diagram and power-gating (PG) sequence of the OS-SRAM, respectively.

As shown in FIG. 20, the OS-SRAM is composed of a 6T standard SRAM, two transistors each including an oxide semiconductor in a semiconductor layer (hereinafter referred to as OS-FETs), and two capacitors.

Parameters for the transistors included in the OS-SRAM in FIG. 20 are listed in Table 1.

TABLE 1

| Width/Length of transistor [nm] | Drive | 200/45 |
|---|---|---|
|  | Access | 130/45 |
|  | Load | 130/45 |
|  | OS-FET | 40/100 |
| Capacitance of capacitor [fF] |  | 0.94 |
| Power-supply voltage [V] | VDM | 1.1 |
|  | (for Si-FET) |  |
|  | VDH | 2.5 |
|  | (for OS-FET) |  |

According to the PG sequence in FIG. 21, power supply is stopped in such a manner that data held at bistable nodes Q and QB are backed up at nodes SN1 and SN2, and then virtual $V_{CM}$ (V-$V_{CM}$) is interrupted. For recovery, the data held at the nodes SN1 and SN2 are returned to the bistable nodes Q and QB; thus, normal operation can be resumed from the state prior to PG.

Figure 22:
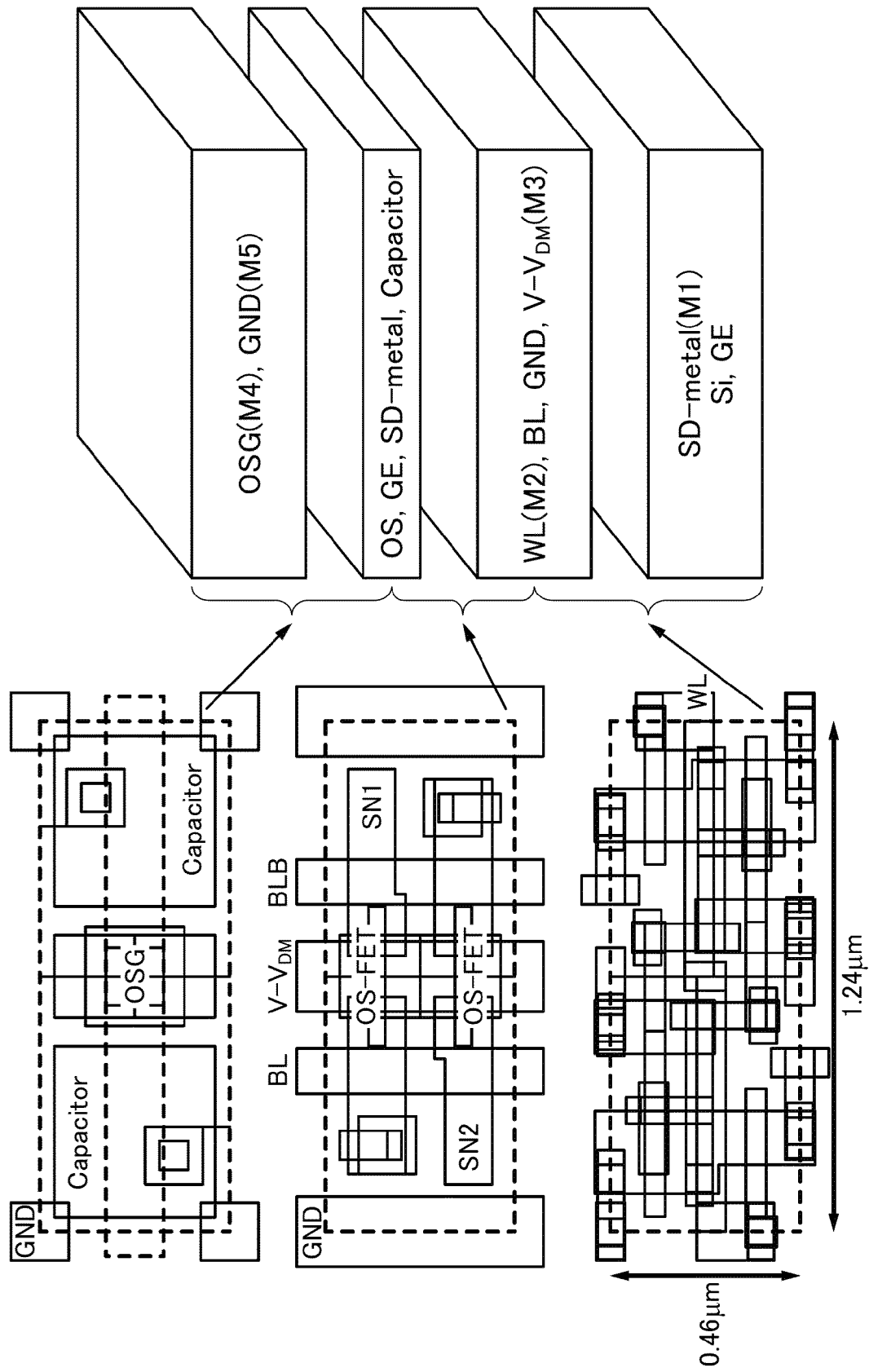
FIG. 22 illustrates a mask layout and layer structures of an OS-SRAM.

FIG. 22 shows the layout of the OS-SRAM. The components added for data backup (two OS-FETs and two capacitors) can be stacked on a layer that includes the standard SRAM. Thus, replacing the standard SRAM with the OS-SRAM increases the area by 0%. The area of the OS-SRAM cell is 0.46 μm×1.24 μm=0.5704 μm² (135 F²).

Although some techniques using, instead of an OS-SRAM, a magnetoresistive RAM (MRAM), a ferroelectric RAM (Fe-RAM), and the like for SRAMs capable of data backup have been suggested, they require an increase in area compared with a standard SRAM. Only the OS-SRAM achieves data backup without an increase in area.

Figure 23:
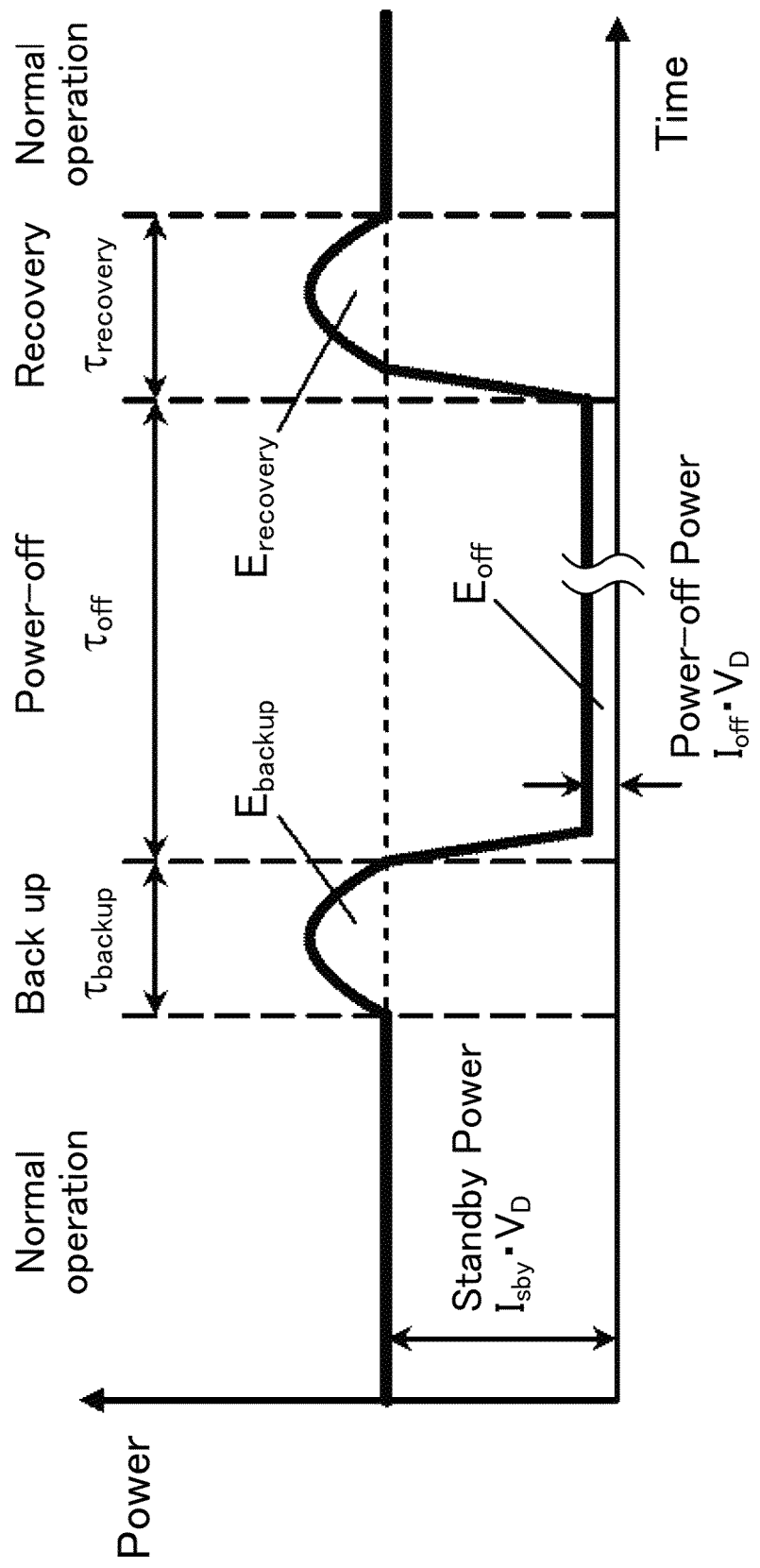
FIG. 23 schematically shows change over time in power consumption of an OS-SRAM.

The simulation demonstrates that the backup time and recovery time are 3.9 ns and 2.0 ns, respectively, in the PG sequence of the OS-SRAM. Here, energy consumption in each period is shown in FIG. 23.

Backup period: When data held at the bistable nodes Q and QB are backed up, energy ($E_{backup}$) is consumed by charge and discharge of the gate capacitance of the OS-FETs and the capacitors.

Power-off period: Standby power is reduced by power-off. The leakage current $I_{off}$ during power-off is ideally 0; however, in reality, leakage current flows through a power switch for power interruption, and the amount of the current depends on the designed size of the power switch transistor. In this simulation, the leakage current of the power switch is set to 0 ($I_{off}$=0) to examine intrinsic PG effects independent of design specifications.

Recovery period: $E_{recovery}$ is consumed to return the data from the backup unit (nodes SN1 and SN2) to the bistable nodes Q and QB. $E_{recovery}$ includes energy due to charge of the gate capacitance of the OS-FETs and a V-$V_{DM}$ line, and the flow-through current at the start of operation of the bistable nodes Q and QB.

Standby power ($I_{sby} \times V_D$) is always consumed in a standby state, and PG can reduce standby power to zero. When standby power in a given period $\tau_{total}$ is reduced by PG, the difference $E_{overhead}$ between energy in all the periods during PG execution ($E_{backup}+E_{off}+E_{recovery}$) and standby power ($I_{sby} \times V_D \times \tau_{total}$) is expressed by Formula (1).

[Formula 1]

$$E_{overhead}=(E_{backup}+E_{off}+E_{recovery})-(I_{sby} \times V_D \times \tau_{total}) \quad (1)$$

Note that zero standby power is not equal to low power consumption. If PG is implemented for a time that is shorter than the time required for $E_{overhead}$ to become 0 (break-even time; BET), PG increases power consumption, as can be seen from Formula (1). BET is expressed by Formula (2).

[Formula 2]

$$BET=(E_{backup}+E_{off}+E_{recovery})/(I_{sby} \times V_D) \quad (2)$$

Figure 24:
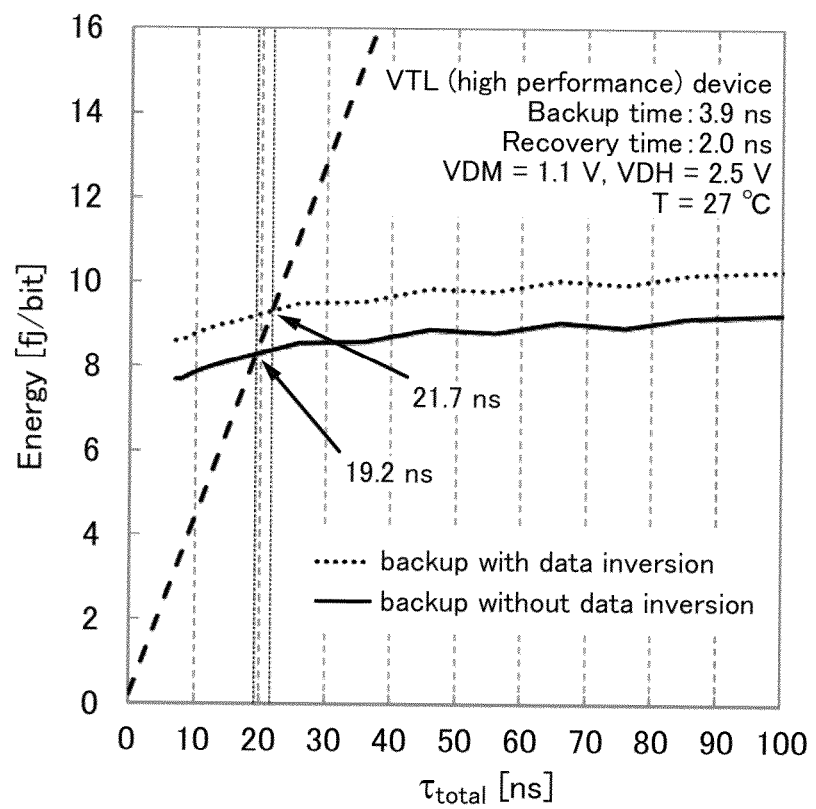
FIG. 24 shows estimated break-even time.

As described above, performing PG in a time shorter than BET does not have the effect of reducing power consumption; thus, it is important to make BET as short as possible. FIG. 24 shows energy during PG execution in the OS-SRAM. The time for power-off ($\tau_{off}$) is varied to obtain a BET between PG and standby energies. The initial conditions for the simulation are the following two states: when data in the bistable nodes Q and QB are different from those in the backup unit, and when data in the bistable nodes Q and QB and the backup unit are the same. BETs in the two conditions (backup with data inversion and backup without data inversion) are estimated at 21.7 ns and 19.2 ns, respectively.

The effects of replacing a standard SRAM with the OS-SRAM on normal operation are examined.

Standby power: 419 nW for both the OS-SRAM and standard SRAM.

Figure 25A:
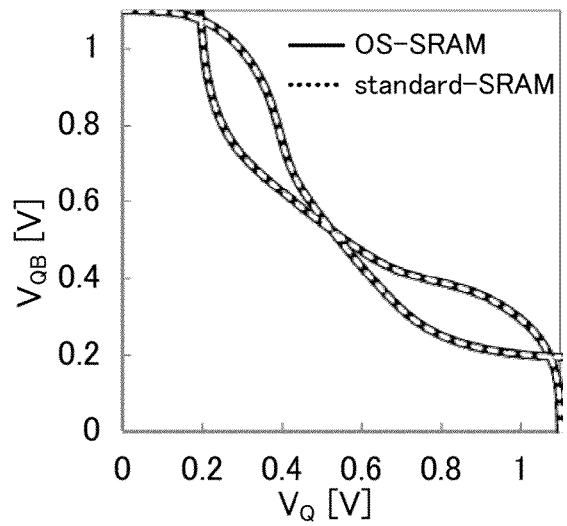
FIGS. 25A to 25C are comparison of static noise margins between an OS-SRAM and a standard SRAM.
Figure 25B:
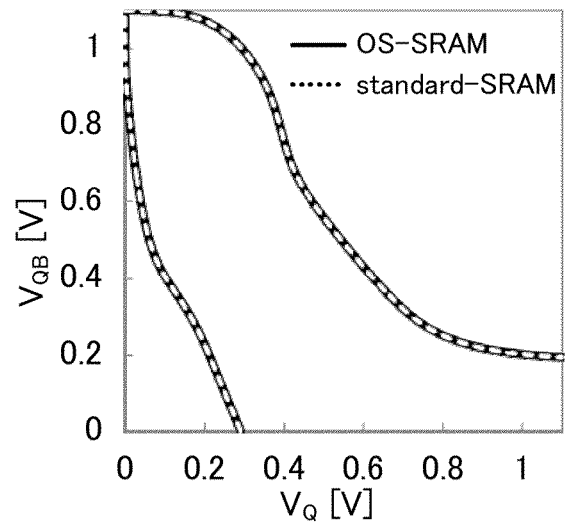
Figure 25C:
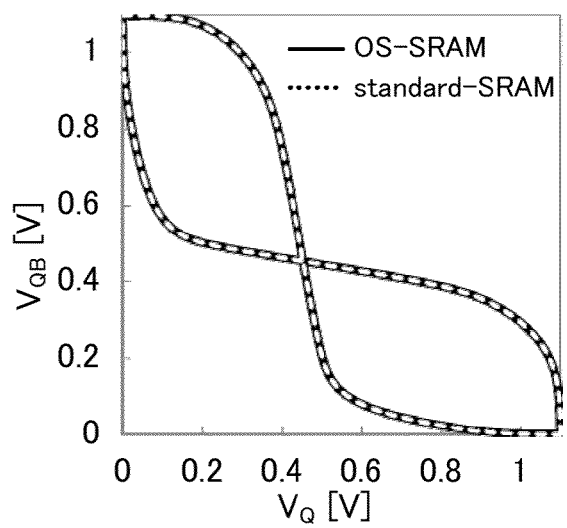

Static noise margin (SNM): FIGS. 25A to 25C show SNM for read, write, and hold operations. As can be seen in FIGS. 25A to 25C, SNMs overlap with each other, that is, no SNM degradation occurs.

Delay time: The bistable node (Q and QB) inversion delay of the OS-SRAM is 17.7 ps and that of the standard SRAM is 15.2 ps. An OS-SRAM array and a standard SRAM array each having 256 rows and 128 columns are used to simulate word line delay and bit line delay. The rise time of the word line in the OS-SRAM is 39.4 ps and that in the standard SRAM is 36.9 ps. In read operations, the time from rise of the potential of the word line until fall of the potential of the bit line to ($V_D$-$V_{BLSENSE}$) in the OS-SRAM is 131 ps, and that in the standard SRAM is 126 ps ($V_{BLSENSE}$=0.3 V).

Dynamic power consumption: The test benches used in the delay simulation are used. The OS-SRAM and standard SRAM have power consumption due to bistable node (Q and QB) inversion of 3.73 fJ and 3.24 fJ, word line power consumption of 79.9 fJ and 76.6 fJ, and bit line power consumption of 3.81 pJ and 3.77 pJ, respectively.

As described above, the impact on normal operation caused by the use of the OS-SRAM instead of the standard SRAM is almost negligible, because the bistable nodes Q and QB used in normal operation are electrically isolated from the backup unit by the OS-FETs.

Table 2 summarizes the characteristics of the OS-SRAM.

TABLE 2

| | | OS-SRAM | Standard-SRAM |
|---|---|---|---|
| VTL (HP) | Area [μm²] | 0.5704 (+0%) | 0.5704 |
| | Standby Power [nW/bit] | 419 (+0%) | 419 |
| | Static Noise Margin | No degradation | — |
| | Bistable node inversion delay [ps] | 17.7 (+16.1%) | 15.2 |
| | Wordline delay [ps] | 39.4 (+6.7%) | 36.9 |
| | Bitline delay [ps] | 131 (+3.9%) | 126 |
| | Bistable node inversion energy [fJ/bit] | 3.73 (+15.2%) | 3.24 |
| | Wordline dynamic energy [fJ] | 79.9 (+4.3%) | 76.6 |
| | Bitline dynamic energy [pJ] | 3.81 (+1.1%) | 3.77 |
| | Backup time [ns] | 3.9 | — |
| | Recovery time [ns] | 2.0 | — |
| | Energy for PG [fJ/bit] | 9.09 | — |
| | BET [ns] | 21.7 | — |
| VTG (LP) | Standby power [nW/bit] | 45.7 (+0%) | 45.7 |
| | Energy for PG [fJ/bit] | 7.09 | — |
| | BET [ns] | 155 | — |
| VTH (LSTP) | Standby power [nW/bit] | 0.589 (+0%) | 0.589 |
| | Energy for PG [fJ/bit] | 6.89 | — |
| | BET [ns] | 11700 | — |

Figure 26:
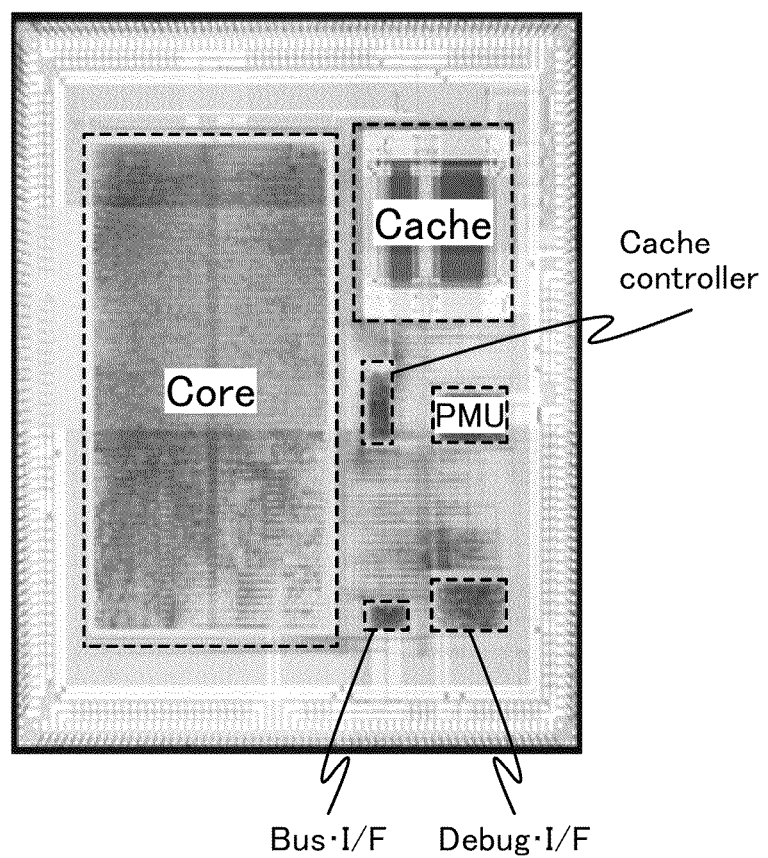
FIG. 26 is a chip photograph of a 32-bit microprocessor that is prototyped.

The OS-SRAM was applied to a cache memory of a 32-bit microprocessor. The prototyped 2-KB cache was fabricated with 350-nm CMOS/180-nm OS process technology. The backup unit of the OS-SRAM consists of OS-FETs with W/L=800 nm/180 nm and 27.1-fF capacitors. FIG. 26 shows a photograph of the chip, and Table 3 shows the specifications of the microprocessor.

TABLE 3

| Technology | | CMOS: 350 nm | OS: 180 nm |
|---|---|---|---|
| Cache | Configuration | Unified | |
| | Capacity | 2 KB | |
| | Associativity | 2 way set associative | |
| | Displacement | LRU method | |
| | Block size | 4 B | |
| | Write method | write-back, write-allocate | |
| | Hit latency | 2 clock cycle | |
| | ISA | MIPS I (32-bit, RISC) | |
| Power-supply voltage | | Si: 2.5 V | OS: 2.5 V/−1 V |
| Clock frequency | | 15 MHz | |

Figure 27:
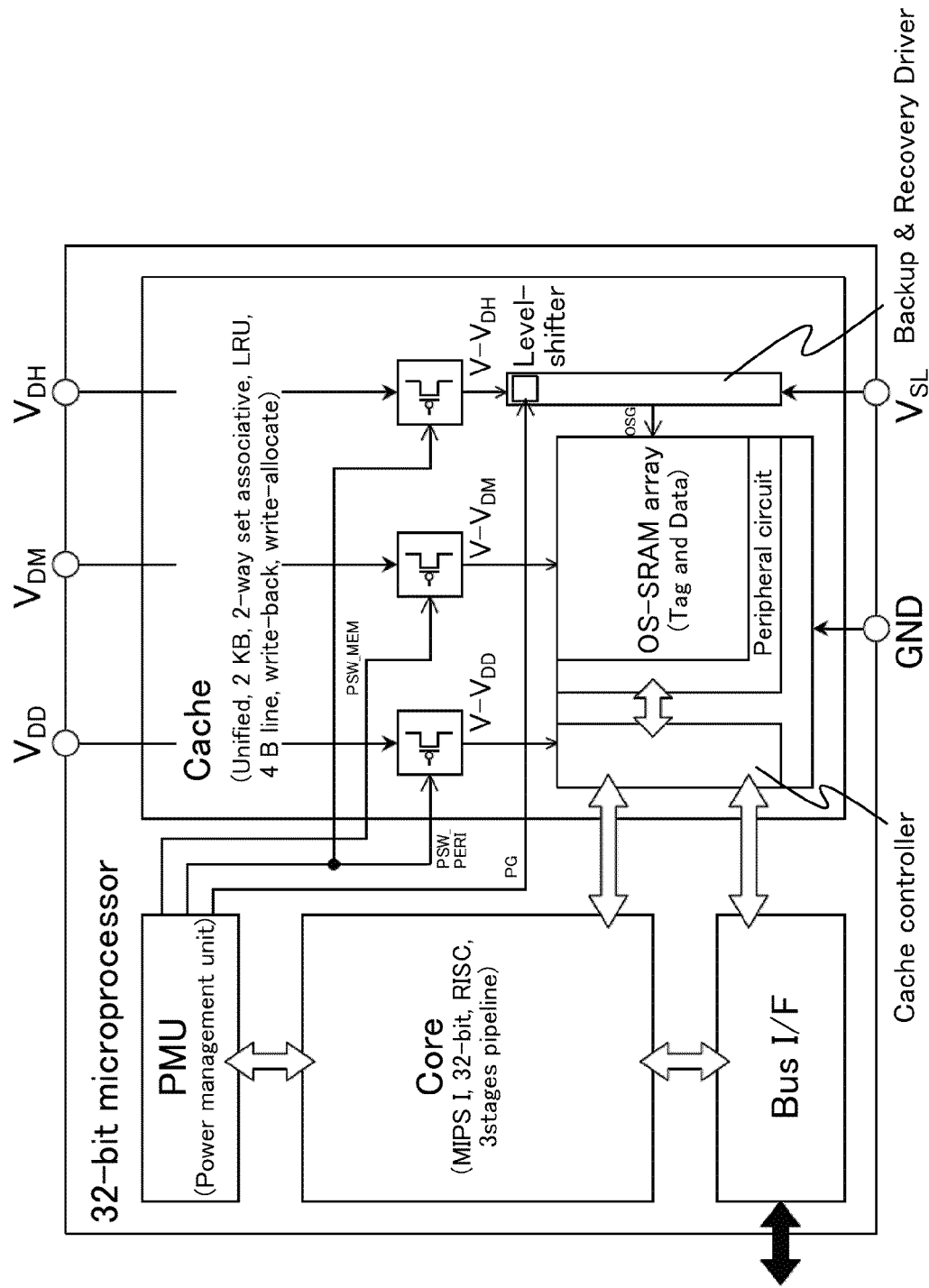
FIG. 27 is a block diagram of a 32-bit microprocessor.

FIG. 27 is the block diagram of the 32-bit microprocessor. The cache includes three power domains: an OS-SRAM array part, a driver circuit part (including a cache controller), and a backup and recovery driver part (with 2.5 V/−1 V). In each of the parts, a power switch is provided on the high-level (V-$V_{DD}$, V-$V_{DM}$, V-$V_{DH}$) line. The PG sequence is executed when a power management unit (PMU) inputs, to the cache, a PG signal for controlling the OS-FET, and PSW_PERI and PSW_MEM signals for controlling the power switches.

Figure 28:
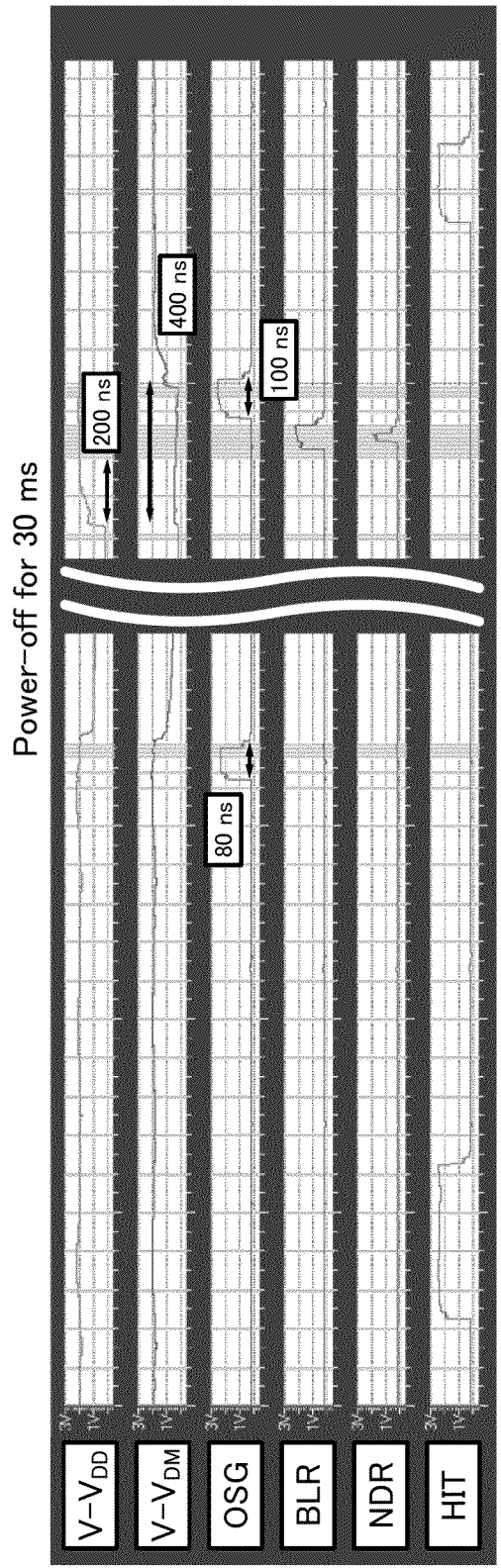
FIG. 28 shows oscilloscope waveforms during power-gating of a cache memory.

As shown in FIG. 28, the oscilloscope waveforms during PG demonstrate the intended PG operation. Signals BLR and NDR in FIG. 28 are used to precharge the bistable nodes Q and QB in the SRAM cell to a GND potential at the start of the recovery operation. The measurements demonstrate backup operation in 80 ns and recovery operation in 400 ns (including 200 ns for power stabilization). The measurements also demonstrate that standby power is 922 nW in normal operation and 22.5 nW during power-off. Thus, PG cuts 97.6% of the standby power.

Figure 29:
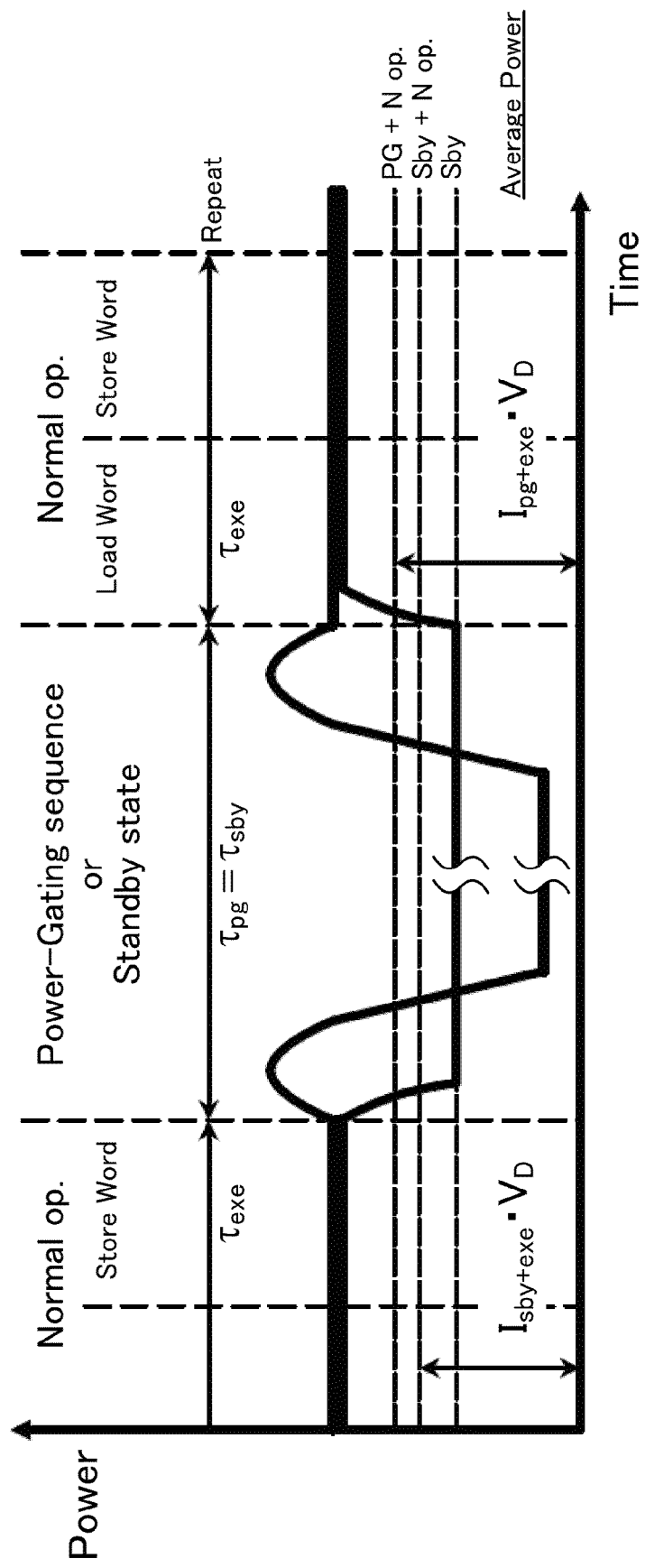
FIG. 29 is a conceptual diagram of measurement of power-gating overhead power.

To measure the BET (FIG. 29), overhead power is calculated from the difference between average power $P_{pg+exe}$ when a PG state is set for $\tau_{pg}$ during normal operation (store word and load word) and average power $P_{sby+exe}$ when a standby state is set for $\tau_{sby}$ (=$\tau_{pg}$) between normal operations (see Formula (3)). The time when overhead power becomes 0 in Formula (3) is denoted by BET.

[Formula 3]

$$P_{overhead}=P_{pg+exe}-P_{sby+exe} \quad (3)$$

Figure 30:
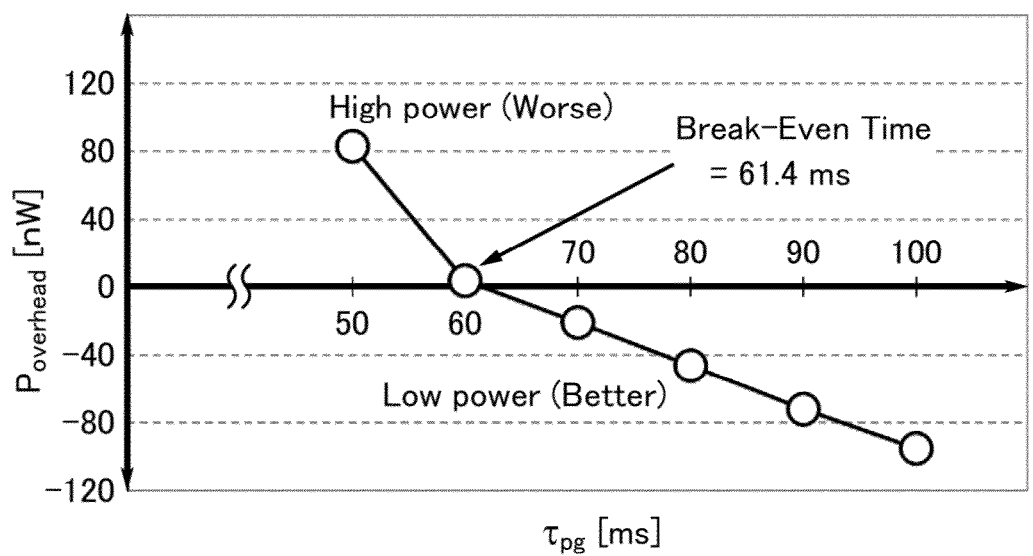
FIG. 30 shows the measurement results of power-gating overhead power.

From FIG. 30, BET=61.4 ms. Furthermore, data holding of one day or longer at 85° C. was ensured.

The prototype demonstrates a 350-nm CMOS/180-nm OS stacked process and shows the applicability of the OS-SRAM to the latest technology without an increase in circuit area. The BET of the 2-KB cache remains in the order of milliseconds because leakage power is not large in a 350-nm CMOS process. The PG technique using the OS-SRAM becomes more effective as a finer process is employed and the leakage current of Si-FETs becomes higher.

This application is based on Japanese Patent Application serial no. 2013-104320 filed with Japan Patent Office on May 16, 2013, Japanese Patent Application serial no. 2013-227346 filed with Japan Patent Office on Oct. 31, 2013, and Japanese Patent Application serial no. 2014-025003 filed with Japan Patent Office on Feb. 13, 2014, the entire contents of which are hereby incorporated by reference.

What is claimed is:

1. A semiconductor device comprising:
a plurality of memories, each of the plurality of memories comprising:

a volatile memory including a first data holding portion; and
a nonvolatile memory including a second data holding portion,
wherein:
the second data holding portion includes a first transistor and a first capacitor,
a first electrode of the first transistor is electrically connected to the first data holding portion,
a second electrode of the first transistor is electrically connected to a first electrode of the first capacitor,
the first electrode of the first capacitor and the first electrode of the first transistor are on a same layer, and
a second electrode of the first capacitor and a gate of the first transistor are on a same layer; and
a first wiring between the plurality of memories,
wherein:
the first wiring is configured to electrically connect gates of first transistors of the plurality of memories, and
a layer in which the first wiring is provided and a layer in which the gate of the first transistor is provided are different.

2. The semiconductor device according to claim 1, wherein in the second data holding portion, the first transistor is turned off and charge is held between the second electrode of the first transistor and the first electrode of the first capacitor, whereby data stored in the first data holding portion is held.

3. The semiconductor device according to claim 1, wherein the first transistor has a semiconductor layer comprising an oxide semiconductor.

4. The semiconductor device according to claim 1, wherein the first transistor is a top-gate transistor.

5. The semiconductor device according to claim 1, wherein the first data holding portion is a circuit including a second transistor having a semiconductor layer comprising silicon.

6. The semiconductor device according to claim 5, wherein the first transistor is provided over the second transistor.

7. The semiconductor device according to claim 6, each of the plurality of memories further comprising:
a second wiring between a layer in which the first transistor is provided and a layer in which the second transistor is provided,
wherein the second wiring is configured to electrically connect the first transistor and the second transistor.

8. A semiconductor device comprising:
a plurality of memories, each of the plurality of memories comprising:
a volatile memory including a first data holding portion and a second data holding portion; and
a nonvolatile memory including a third data holding portion and a fourth data holding portion,
wherein:
the third data holding portion includes a first transistor and a first capacitor,
the fourth data holding portion includes a second transistor and a second capacitor,
a first electrode of the first transistor is electrically connected to the first data holding portion,
a second electrode of the first transistor is electrically connected to a first electrode of the first capacitor,
a first electrode of the second transistor is electrically connected to the second data holding portion,
a second electrode of the second transistor is electrically connected to a first electrode of the second capacitor,
the first electrode of the first capacitor and the first electrode of the first transistor are on a same layer, and
a second electrode of the first capacitor, a second electrode of the second capacitor, a gate of the first transistor, and a gate of the second transistor are on a same layer; and
a first wiring between the plurality of memories,
wherein:
the first wiring is configured to electrically connect the gate of the first transistor and the gate of the second transistor, and
a layer in which the first wiring is provided and a layer in which the gate of the first transistor and the gate of the second transistor are provided are different.

9. The semiconductor device according to claim 8,
wherein in the third data holding portion, the first transistor is turned off and charge is held between the second electrode of the first transistor and the first electrode of the first capacitor, whereby data stored in the first data holding portion is held, and
wherein in the fourth data holding portion, the second transistor is turned off and charge is held between the second electrode of the second transistor and the first electrode of the second capacitor, whereby data stored in the second data holding portion is held.

10. The semiconductor device according to claim 8, wherein each of the first transistor and the second transistor has a semiconductor layer comprising an oxide semiconductor.

11. The semiconductor device according to claim 8, wherein each of the first transistor and the second transistor is a top-gate transistor.

12. The semiconductor device according to claim 8,
wherein the first data holding portion is a circuit including a third transistor, and the second data holding portion is a circuit including a fourth transistor, and
wherein each of the third transistor and the fourth transistor has a semiconductor layer comprising silicon.

13. The semiconductor device according to claim 12, wherein the first transistor and the second transistor are provided over the third transistor.

14. The semiconductor device according to claim 13, each of the plurality of memories further comprising:
a second wiring between a layer in which the first transistor and the second transistor are provided and a layer in which the third transistor and the fourth transistor are provided,
wherein the second wiring is configured to electrically connect the first transistor, the second transistor, the third transistor, and the fourth transistor.

* * * * *